United States Patent [19]

Sangyoji et al.

[11] Patent Number: 5,049,920
[45] Date of Patent: Sep. 17, 1991

[54] PHOTOCOPYING METHOD AND APPARATUS

[75] Inventors: Kazuo Sangyoji; Takemi Yamamoto; Shunichi Higashiyama; Masashi Ueda; Akira Sago; Osamu Takagi; Yumio Matsumoto, all of Nagoya; Kiyoharu Hayakawa, Aichi, all of Japan

[73] Assignee: Brother Kogyo Kabushiki Kaisha, Aichi, Japan

[21] Appl. No.: 423,683

[22] Filed: Oct. 18, 1989

Related U.S. Application Data

[63] Continuation of Ser. No. 136,738, Dec. 22, 1987, abandoned.

[30] Foreign Application Priority Data

| Dec. 29, 1986 [JP] | Japan | 61-314359 |
| Jan. 30, 1987 [JP] | Japan | 62-21629 |
| Mar. 16, 1987 [JP] | Japan | 62-60721 |
| Jun. 4, 1987 [JP] | Japan | 62-140182 |
| Jun. 9, 1987 [JP] | Japan | 62-143487 |

[51] Int. Cl.$^5$ .................. G03B 27/32; G03B 27/52
[52] U.S. Cl. ................................ 355/27; 355/38; 355/79; 430/138
[58] Field of Search ............. 355/38, 79, 27, 100, 355/106; 430/138

[56] References Cited

U.S. PATENT DOCUMENTS

| 1,563,499 | 12/1925 | Knudsen | 355/77 |
| 2,008,904 | 7/1935 | Fishback et al. | 355/79 |
| 2,246,561 | 6/1941 | Wheelan et al. | 355/77 |
| 3,817,618 | 6/1974 | Riley et al. | 355/100 |
| 4,012,122 | 3/1977 | McVeigh | 355/79 |
| 4,152,068 | 5/1979 | Bickl et al. | 355/38 |
| 4,214,834 | 7/1980 | Findeis et al. | 355/38 |
| 4,279,502 | 7/1981 | Thurm et al. | 355/38 |
| 4,399,209 | 8/1983 | Sanders et al. | |
| 4,440,846 | 4/1984 | Sanders et al. | |
| 4,448,516 | 5/1984 | Arney et al. | |
| 4,592,986 | 6/1986 | Nelson et al. | |

FOREIGN PATENT DOCUMENTS

| 164931 | 12/1985 | European Pat. Off. |
| 2111232 | 6/1983 | United Kingdom |
| 2112536 | 7/1983 | United Kingdom |
| 2113860 | 8/1983 | United Kingdom |

*Primary Examiner*—Monroe H. Hayes
*Attorney, Agent, or Firm*—Oliff & Berridge

[57] ABSTRACT

A photocopying system without using an intermediate film is disclosed. In this system, the photo-pressure sensitive sheet and an original are tightly overlapped on a photocopying stage. Scratching scars generated by friction therebetween can be avoided by drive means for changing a distance therebetween. Images on the reverse side of the original can be protected from being duplicated by changing a direction of a light beam. Figure/character images, as well as image trimming, can be arbitrarily photocopied by exposing to a light through display on liquid crystal panel.

46 Claims, 21 Drawing Sheets

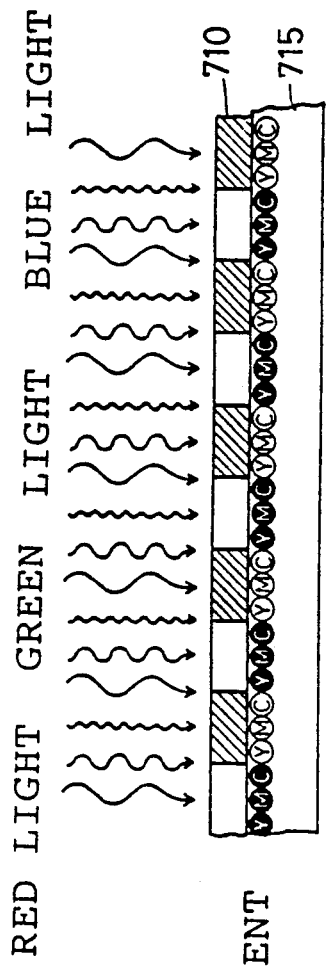

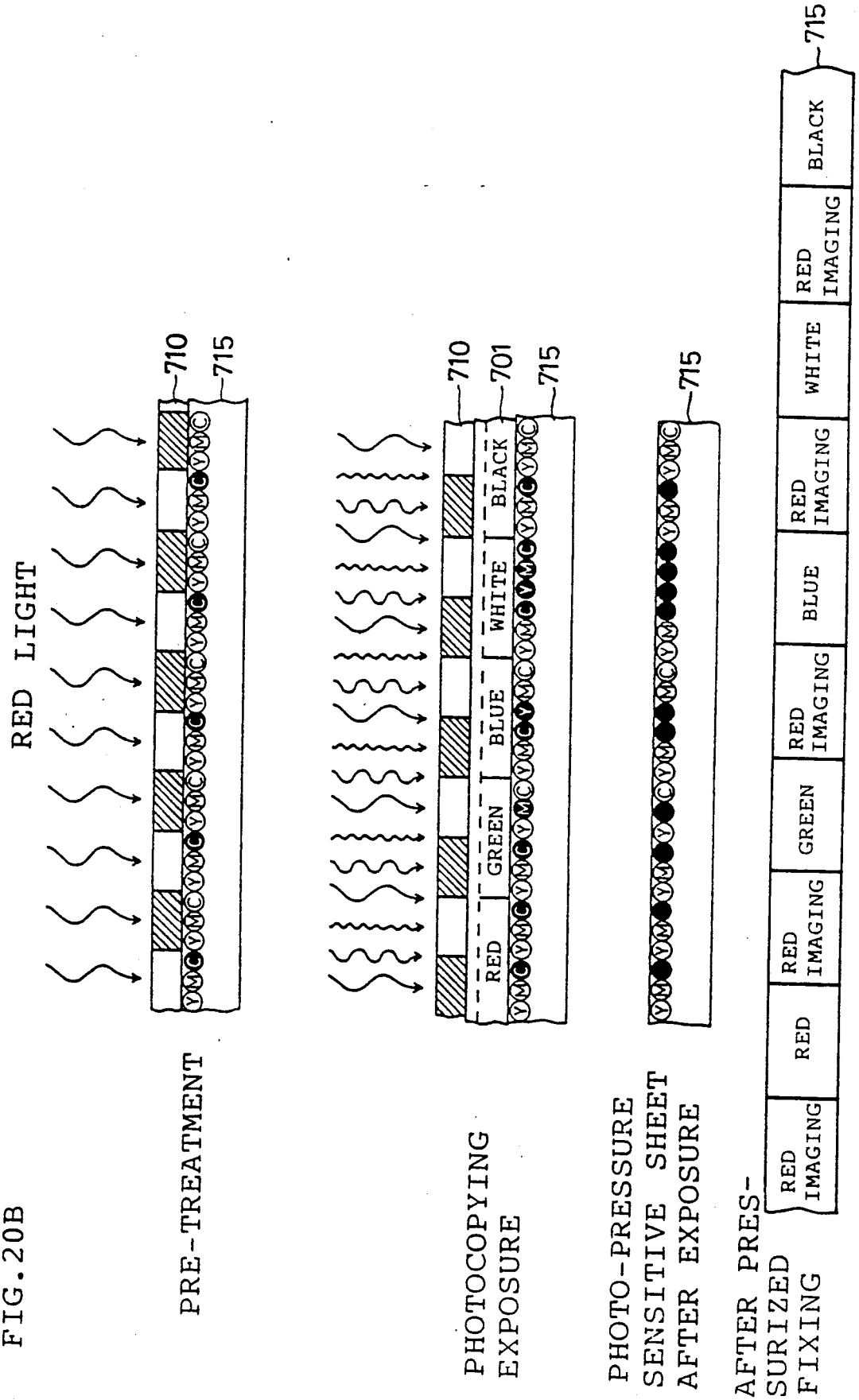

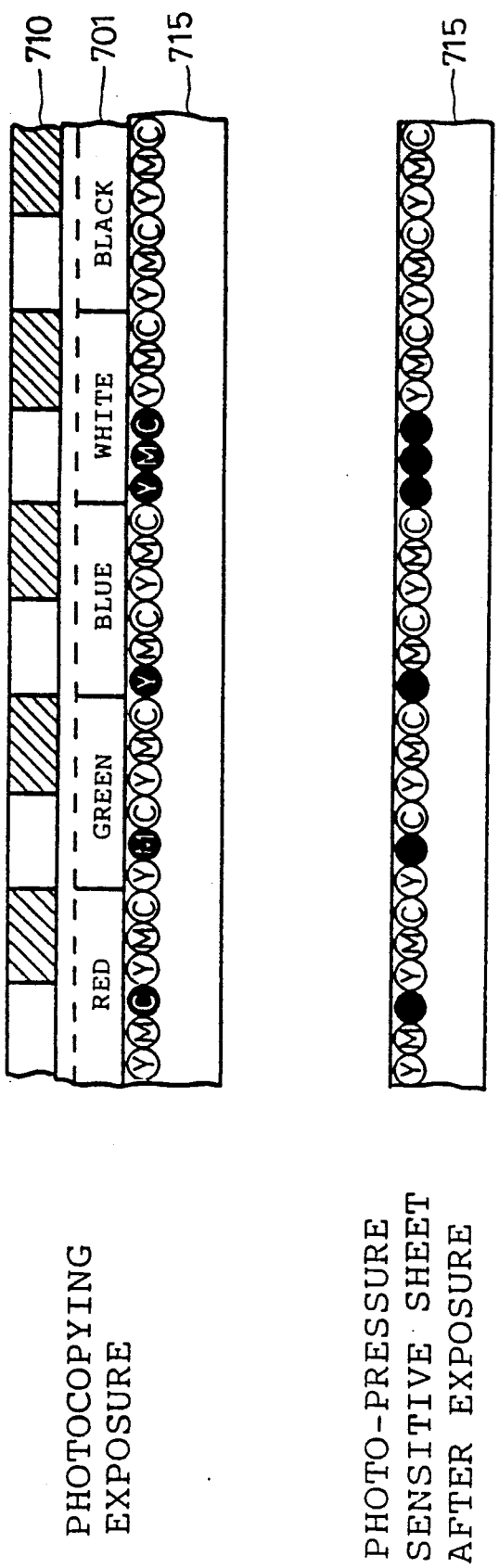

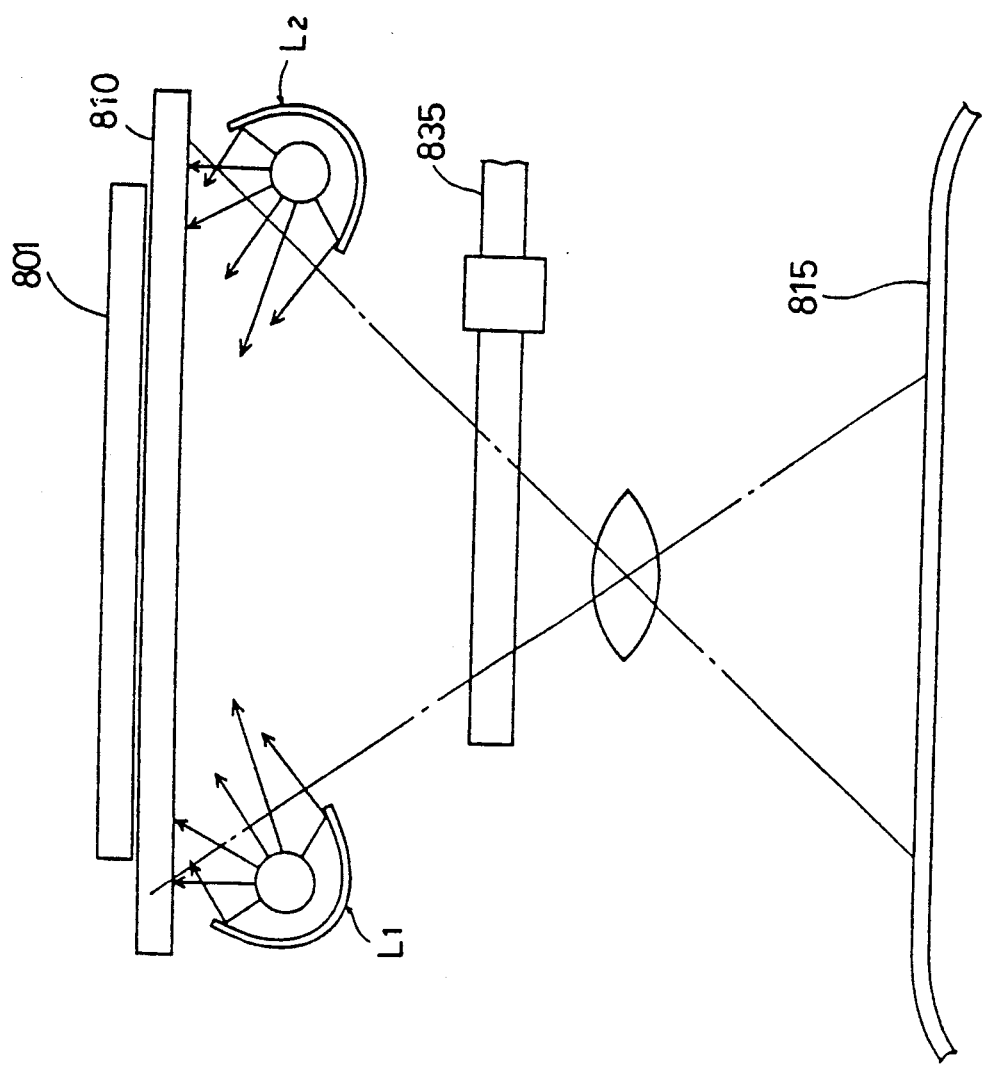

PHOTOCOPYING METHOD AND APPARATUS

This is a continuation of application Ser. No. 07/136,738 filed Dec. 22, 1987 now abandoned.

BACKGROUND OF THE INVENTION

The present invention relates to photocopying method and apparatus and more particularly to a photocopying method and apparatus using a so called photo sensitive sheet, in particular, photo-pressure sensitive sheet. Conventionally, in the photocopying apparatus which uses the photo-pressure sensitive sheet, an image is photocopied once on a transparent intermediate film in the same manner as photoprinting and then photocopied by using this intermediate film on a photo-pressure sensitive sheet (U.S. application Ser. No. 32,865, Mar. 31, 1987). Using this type of conventional photocopying apparatus, it is therefore time-consuming to produce an intermediate film prior to photocopying. At the same time, a large scale photocopying apparatus is required.

Moreover, the total running cost is high and the total time required is lengthy. To solve these problems, a system in which an original can be directly exposed must necessarily be developed. Many means are considered to obtain this concept. One of these is to utilize a reflected light beam after it is directly focused on the original. Upon reflection, this beam is projected on the photopressure sensitive sheet to focus images (U.S. application Ser. No. 943,195, Dec. 18, 1986).

However, this kind of imaging system requires additional optical means to radiate these reflected beams onto the photo-pressure sensitive sheet, thus resulting in a large scale system as well as great expense in total imaging time and cost. Considering these factors, the most effective imaging method is to expose the photo-pressure sensitive sheet to a light without using the intermediate film and the reflected beams.

In order to solve the problem, a photocopying apparatus is disclosed in which the original is directly attached to the monochromic photo-pressure sensitive sheet without using intermediate film (U.S. application Ser. No. 24,432, Mar. 11, 1987). This equipment uses two overlapping sheets, one of which is an original and the other a photopressure sensitive sheet (U.S. Pat. No. 4,399,209, U.S. Pat. No. 4,440,846).

Now, in a photocopying apparatus which is described in the U.S. application Ser. No. 24,432, the photo-pressure sensitive sheet is subject to damage due largely to a rugged surface of the original when the original and the photo-pressure sensitive sheet are overlapped. Usually, the original and photo-pressure sensitive sheet are overlapped. Then, frictional forces also occur between original and sheet, thus causing frictional damage.

Due to the friction caused by overlapping, a photopressure sensitive substance on the surface is often ruptured and therefore a fine photocopy finish is no feasible on a photo-pressure sensitive sheet or a transfer sheet.

Then, in said photocopying apparatus, a good photocopying quality is not attained, especially when it comes to photocopying a specific original or the like. One bottleneck problem is that the images on either sides of the original are simultaneously copied, including any figures described thereon.

This photocopying of the reverse side of the original should be avoided in this case. As long as this apparatus is concerned, images pass through optical systems interposed between the light sources and original. Only the same images as drawn on the original are projected and duplicated on the photo sensitive sheet. If images other than those on the original are to be photocopied, still further improvement is necessary.

Especially when images are to be supplemented with figures, characters, symbols ,etc. to explain more clearly or modify the image, the black/non-black imaging(exposing an original to a light through display on the liquid crystal panel) and image trimmings are conducted.

SUMMARY OF THE INVENTION

Thus, a principal object of the present invention is to provide a multicolor photocopying method and apparatus in which images are formed directly on a transfer sheet or a color photo-pressure sensitive sheet by exposing a photo-pressure sensitive sheet having capsules thereon to a light and then rupturing the capsules by a presence so as to react a chromogenic material encapsulated in the capsules with a developing agent coated on the transfer sheet or a photo-pressure sensitive sheet, thus yielding an image on the transfer sheet or the photo-pressure sensitive sheet.

Another object of the present invention is to provide a photocopying apparatus in which there is provided a filtering plate between the original and photo sensitive sheet so that the photo sensitive sheet is not damaged by friction between the original and the photo sensitive sheet and the original is not stained.

Still another object of the present invention is to provide a photocopying apparatus in which there is provided a drive means for changing a distance between the original and the photo sensitive sheet so that the original is overlapped onto the photo sensitive sheet, exposed to a light and the sheet and original are separated from each other prior to transfer.

Another more particular object of the present invention is to provide a photocopying apparatus in which only the front side of the original is photocopied with high resolution and good tonal qualities even when characters and symbols are indicated on the reverse side of the original.

A still further object of the present invention is to provide a photocopying apparatus in which images are photocopied with an arbitrary combination of characters, figures, symbols, etc., including insertions and deletions, and are turned into multicolor expression coupled with imaging of black/non-black performance (means: by exposure to the light through a display on the liquid crystal panel).

BRIEF DESCRIPTION OF THE DRAWINGS

FIGS. 20 A,B,C are explanatory illustrations to show photocopying; and

FIG. 21 is a eighth embodiment of the present invention.

DETAILED DESCRIPTION OF THE INVENTION

Figure 1:
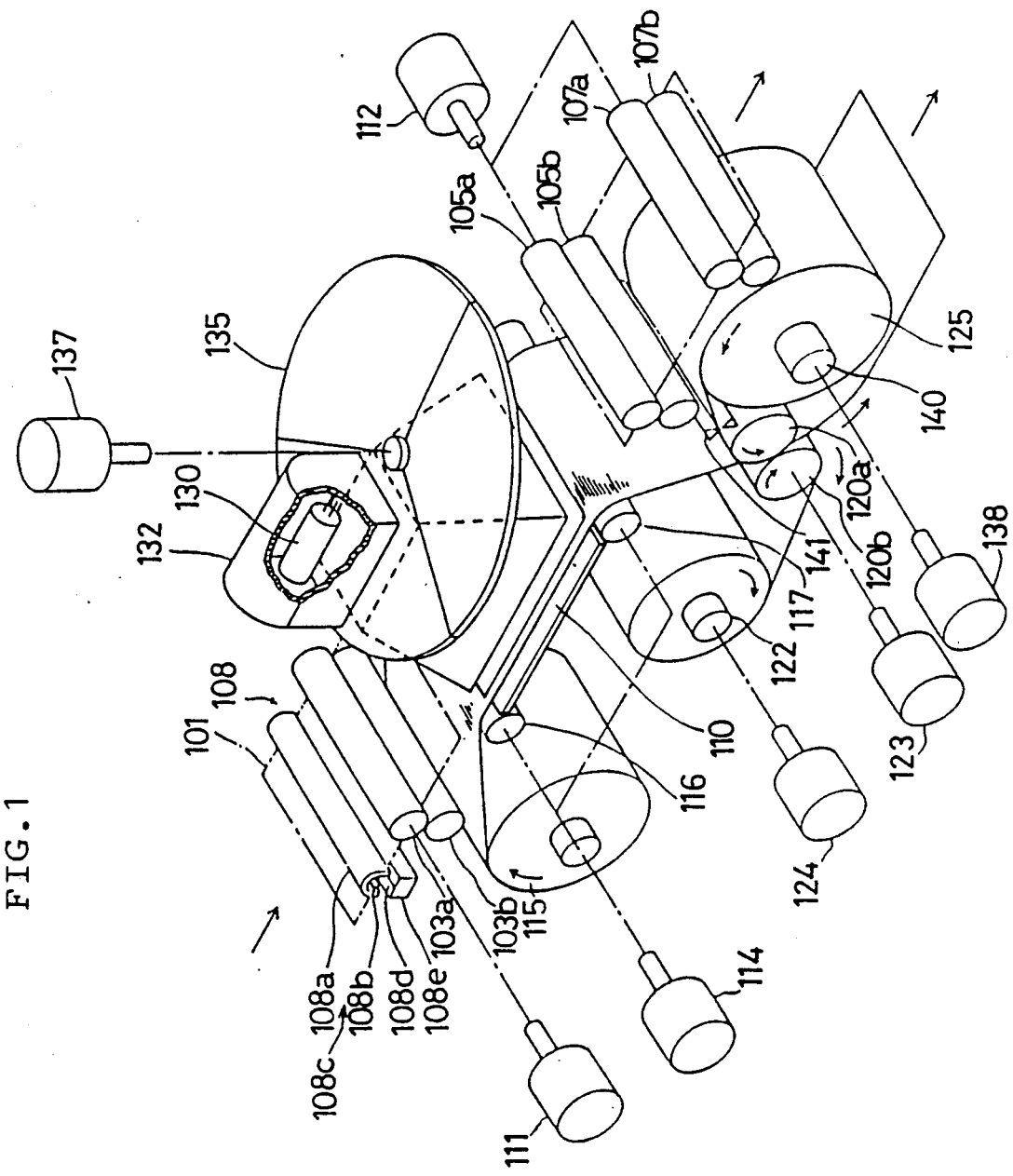
FIG. 1 is a schematic illustration of a multicolor photocopying apparatus showing a first embodiment in accordance with the present invention.

FIG. 1 illustrates a first preferred embodiment of the present invention. In this illustration, a general perspective of a multicolor photocopying apparatus is shown. As shown in this preferred embodiment, the apparatus is provided with 3 sets of transferring rollers, 103a, 103b, 105a, 105b, 107a, 107b driven by motors 111,112 for transferring an original 101 to be photocopied from an original insertion port (not shown) to a photocopying stage 110 through a permeability detection sensor 108, and further from the photocopying plate 110 to an original chute-out port after photocopying.

The permeability sensor 108 is provided with an upper unit 108c having a light-converging mirror 108a and a fluorescent lamp 108b and a lower unit 108e having a photodiode array 108d arranged in one orderly row across the width of the original 101. The permeability is detected when the original 101 is transferred between the lower unit 18e and the upper unit 18c of the detection sensor 108.

There is provided a motor 114 and paper transfer rollers 116,117 fore and aft of the photocopying stand 110 through which the original 101 is transferred. A photo-pressure sensitive sheet 115 is transferred from an existing roll through the path of original 101 onto the roller 116, photocopying plate 110, paper transferring roller 117 and a set of pressing rollers 120a, 120b driven by a motor 123; and finally rolled by a take-up roller 122 driven by a motor 124.

Hence, the photo-pressure sensitive sheet 115 is snugly overlapped on the photocopying stand 110 and the original 101 is transferred thereon. A static electricity generating device(not shown) is connected to the photocopying stand 110 to hold the original 101 on the photo-pressure sensitive sheet 115 in photocopying.

The photo-pressure sensitive sheet 115 is provided evenly on a surface thereof with an array of microcapsules which have therein photo-curing resin as a photo-curing photo-polymer initiator and chromogenic material etc. There are three kinds of microcapsules, each of which is sensitive to a microwave length approximately 450 nm, 550 nm, and 650 nm. The encapsulated chromogenic material is varied for a wide variety of developing functions. Various types of chromogenic materials are well known.

The details of these chromogenic materials are disclosed in Japanese Published Examined Patent Application 45-4698, Japanese Published Examined Patent Application 49-103710, Japanese Published Examined Patent Application 49-5929, Japanese Published Unexamined Patent Application 54-111528, Japanese Published Examined Patent Application 45-14039 and Japanese Published Examined Patent Application 46-16052 et al.

Figure 2:
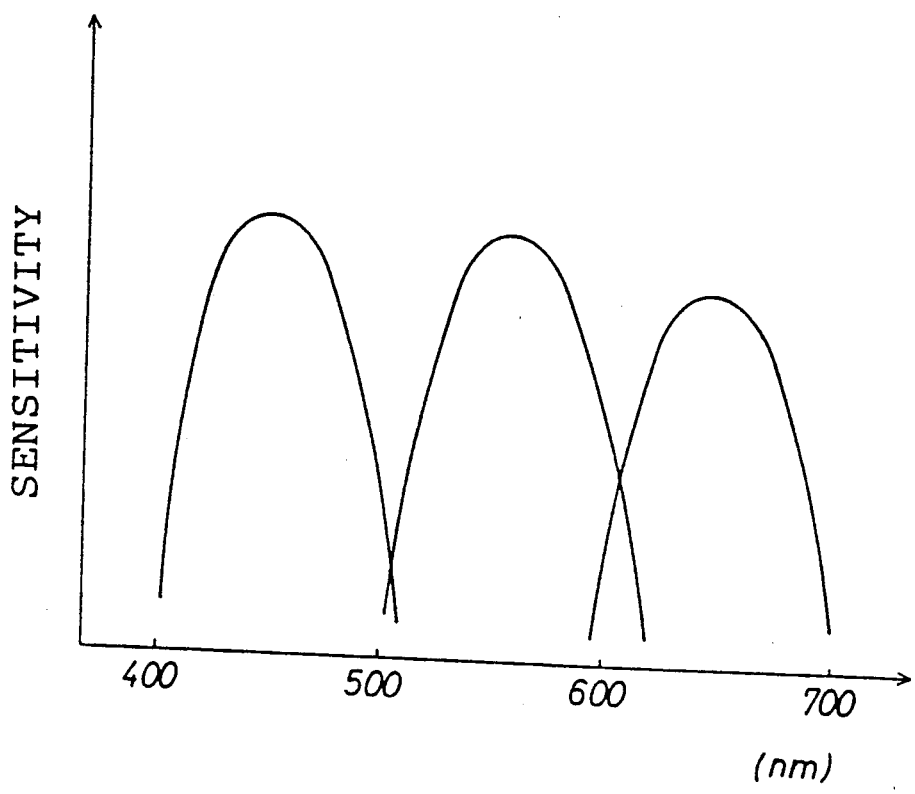
FIG. 2 is a graph showing photo-sensitivity characteristics of a photo-pressure sensitive sheet.

There are three color types of microcapsules; yellow, magenta, and cyan. The yellow microcapsules are carried on the photo-pressure sensitive sheet 15 and contain a chromogenic material which reacts with a developing agent coated on a transfer sheet as described hereafter to develop yellow color. This developing agent is produced by using, for example acrylamide, diacrylamide, triacrylamide etc. as a photo-curing resin, and 2,2,5,5-tetramethyltetrahydro-3,4-furandione well-known as camphorquinon, parabanic acid, imidazoletrion, etc. as a photo-polymerizing initiator. This microcapsule is sensitive to the maximum microwavelength of about 450 nm for polymerization (FIG. 2), and is cured when exposed to light for a certain period of time (This is hereafter called the yellow microcapsule.).

Another type of microcapsule contains a chromogenic material such as fluoran-family, indolyl-phthalide family, rhodamine-lactam family materials, etc, to develop magenta color on the developing agent and is formed by using, for example , glycidylmethacrylate containing polyvinylpyrrolidone as a photo-curing resin and substances below as a photo-polymerizing initiator.

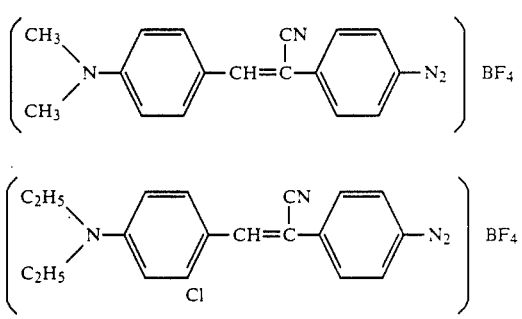

This microcapsule is most sensitive to a microwave length of about 550 nm (FIG. 2), and is cured/polymerized when exposed to this light for a certain period of time. (This type of microcapsule is hereafter called the magenta microcapsule.) Still another type of microcapsule is a microcapsule containing chromogenic material such as triphenylmethane-phthalide family, spiro-pyran family, triphenylmethane family materials to develop cyan color on the developer 125 and is produced by using, for example, bisphenol-A-diglycidylether containing polyvinyl pyrrolidone as a photo-curing resin, and as a photo-polymerizing initiator of structure similar to that shown below.

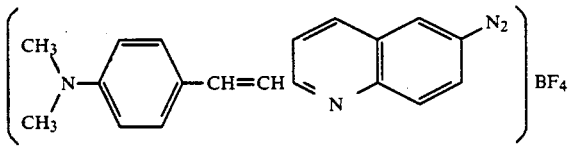

This microcapsule is most sensitive to a maximum microwavelength of about 650 nm for photo-polymerization, and is polymerized/cured when exposed to the light for a certain period of time(This microcapsule is hereafter called the cyan microcapsule.). The manufacturing methods involving choromogenic microcapsules and photo-curing materials includes well-known coacervation, interfacial polymerization etc.

There is a light box 132 housing a xenon lamp 130 on an upper part of the photocopying stand 110 for transferring/mounting the original 101 and the photo-pressure sensitive sheet 115 as constructed above. The white light (radiated as wavelengths 400 nm to 700 nm) emitted by the xenon lamp 130 is resolved into either one of the colors, red, green, blue and transmitted to the original 101 to be photocopied.

A halogen tungsten lamp, as well as a xenon lamp 130 can be used as a light source. The light box 132 has therein a concave mirror capable of directing light from the lamp 130 effectively to a filter 135. The filter 135 is divided into three parts in accordance with the colors to be resolved.

Figure 3:
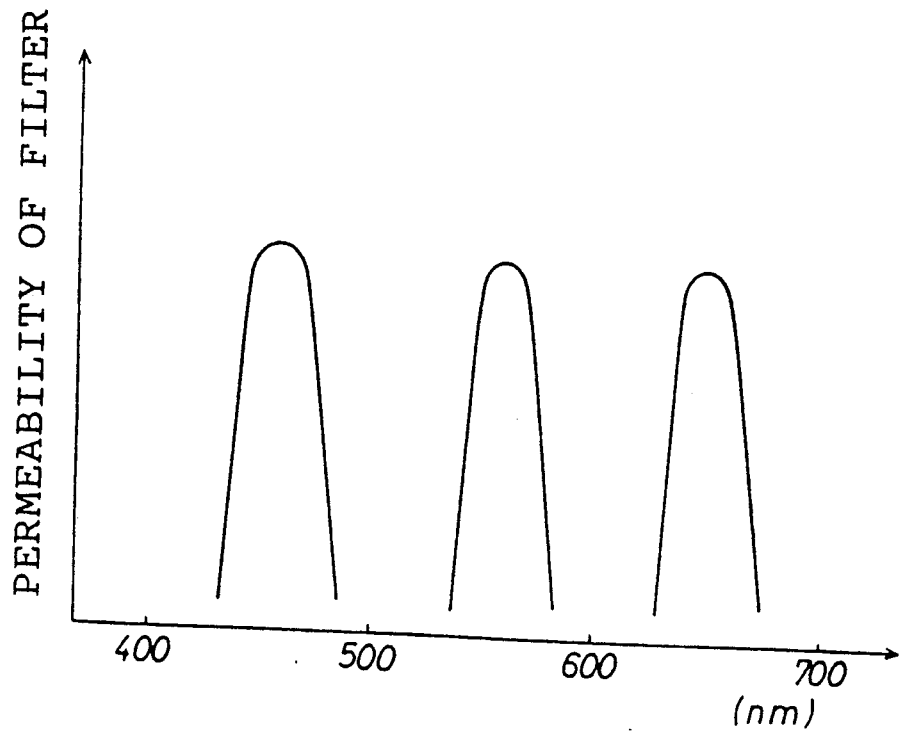
FIG. 3 is a graph showing permeability of a filter.

The permeability of the filter is maximum as shown in FIG. 3 for the microwavelength of 450 nm for blue, 550 nm for green and 650 nm for red. A transfer sheet 125, rolled on a roll-out roller 140, is rolled out after exposure by a motor 138 coupled to a mechanism (not shown)in synchronization with the transfer of photo-pressure sensitive sheet.

The passage through which the transfer sheet 125 is rolled out is provided with an electric cutter 141 to cut off a proper sized piece from sheet 125. The piece cut from sheet 125 is then fed to the photocopy chute-out port by a transferring mechanism (not shown) via pressing roller 120a, 120b.

In operation, (1) First, a colored picture as the original 101 is inserted from an original insertion port and fed through the permeability detection sensor 108 to the photo-copying stage 110 via the transferring roller 103.

(2) Next, the permeability of imaged area and non-imaged area of the original 101 is sensed. Here, the exposing time is determined by the greatest permeability value among these sensed. In principle, the greatest permeability is obtained on the non-imaged areas. Then, the exposing time Tb is determined from the permeability of non-imaged areas. As for the permeabilities to the three colors, each can be inferred by using a filter equivalent to filter 135 or inferred from permeability to white light.

Figure 4:
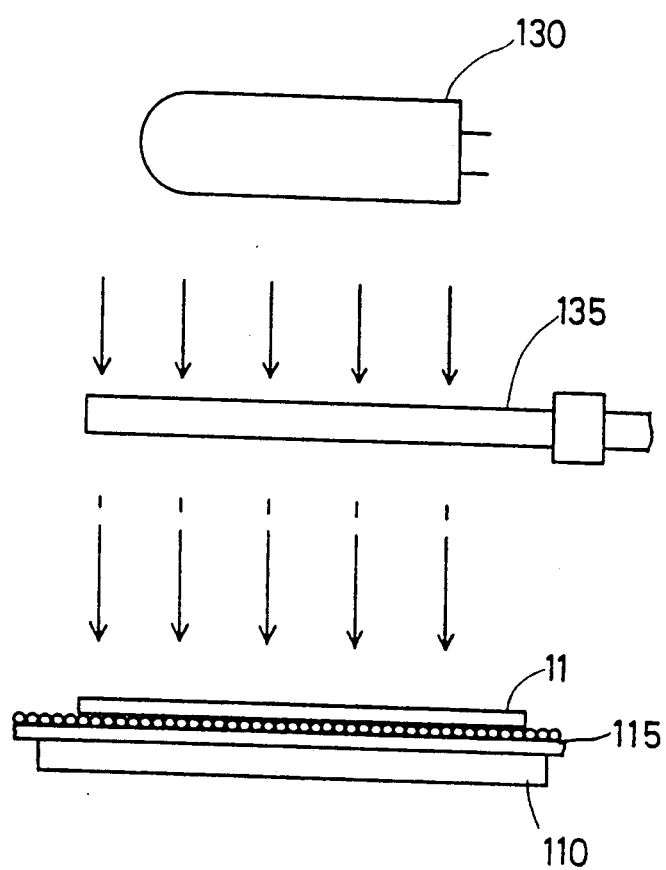
FIG. 4 is an explanatory illustration showing a model of curing behaviors.

(3) Next, the original 101 fed to the photocopying stage 110 is held thereto along with photo-pressure sensitive sheet 115 by a static electricity force and exposed. One mode of exposing is shown in FIG. 4. In this embodiment, the imaged surface of the original 101 is arranged face to face with the photo-pressure sensitive sheet 115. The exposing is performed in the following order.

(a) Driven by a motor 137, the red portion of filter 135 is rotated to be under the xenon lamp 130. Under this filtering condition, red light only is transmitted onto the original 101. Red light is projected to reach the photo-pressure sensitive sheet 115 while colors other than red among the multicolor image are blocked by the filter.

Among the chromogenic capsules, the cyan has the greatest degree of photo-polymerization in the presence of red light. This capsule is most sensitive to microwavelength of approximately 650 nm, and is cured by photo-polymerization which increases the mechanical resistance to rupture. In this embodiment, the exposing time Tb determined by permeability is approximately 7 seconds.

(b) Next, the filter 135 is rotated by the motor 137 to select the green portion, and exposure with green light lasts approximately 3 seconds. As a result, only those magenta microcapsules of photo-pressure sensitive sheet 115 right under the green portions of original 101 are cured.

(c) Next, the filter 135 is rotatably driven by the motor 137 to select the blue portion and exposure lasts for approximately 3 seconds. The yellow microcapsules are cured. The exposing time of about 3 seconds for green and blue portions is short compared with the red portion because the magenta and yellow microcapsules are both constructed differently and photopolymerized/cured within the shortest time. This exposing time can also be arbitrarily determined by a combination/selection of photo-curing resin and photo polymerization initiator.

Figure 5:
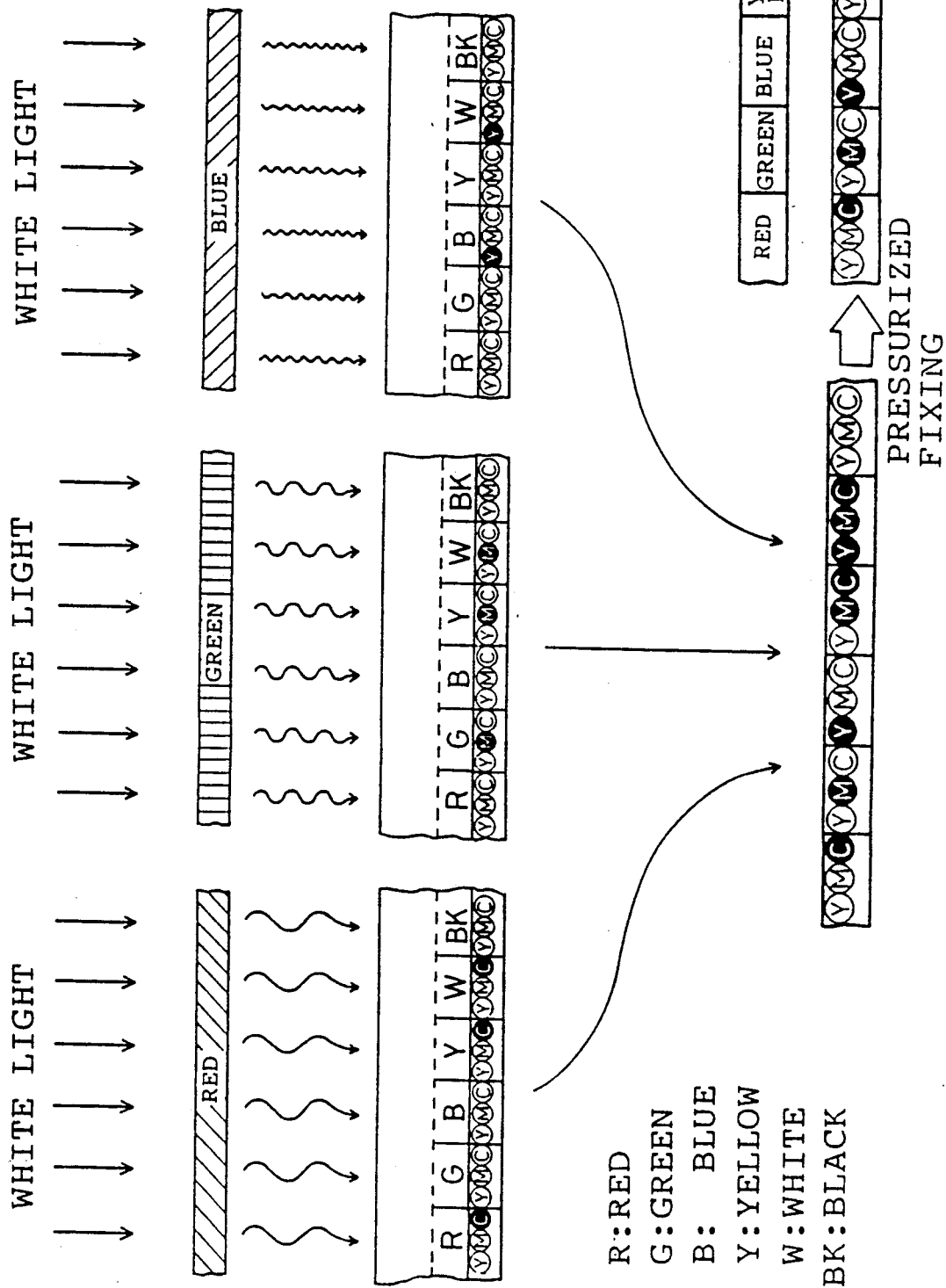
FIG. 5 is an explanatory illustration showing curing and not curing of microcapsules corresponding to exposure of each color.

An exposing model is shown in FIG. 5 with microcapsules cured by three colors, red, green and blue. During the exposures, the original 101 does not jiggle in the photocopying plate 110 because it is snugly pressed against the photo-pressure sensitive sheet 115. The upper part of FIG. 5 shows a manner in which these three colors, red, green, blue are filtered and applied to the microcapsules on the sheet 115. The lower part of the figure shows a manner in which microcapsules are cured after exposure to all three colors depending on the sensitivity of microcapsules to the respective filtered colors. In this figure, uncured microcapsules are shown by white letter e,crc/Y/ Ⓜ Ⓒ and those cured are shown by black letter.

(4) After exposure is done in this manner, the photo-pressure sensitive sheet 115 is rolled up onto the roller 122 driven by the motor 124. In this case, the original 101 is also transferred with the photo-pressure sensitive sheet 115 but detaches therefrom due to its rigidity when the photopressure sensitive sheet 115 turns toward pressing rollers, 120a, 120b driven by the motor 123 via the paper-transferring roller 117. Then, the original 101 is transferred toward the transferring rollers, 105a, 105b driven by the motor 112 and rolled out into a chute-out port (not shown) via the transferring rollers 107a and 107b.

Meanwhile, the photo-pressure sensitive sheet 115 starts to be rolled up, and the transfer sheet 125 simultaneously starts to be rolled out by the motor 138. The transfer sheet 125 is rolled through the cutter 141 into the pressing rollers 120a, 120b driven by the motor 123. As a result, the photo-pressure sensitive sheet 115 and the transfer sheet 125 are integrally pressed together by pressing rollers 120a, 120b.

When pressed, only the uncured microcapsules on the photo-pressure sensitive sheet 115 are ruptured. At this time, chromogenic material encapsulated in the ruptured microcapsules is effused from these capsules (capsules marked in black letter Ⓨ Ⓜ Ⓒ in FIG. 5).

The encapsulated chromogenic material which is effused from the capsules by their rupture chemically reacts with developing agents coated on the transfer sheet, causing color images to be developed on the transfer sheet 125 (FIG. 5). When the proper length of the transfer sheet 125 is rolled out, it is cut off by the cutter 141. Then, the cut off piece of transfer sheet 125 is transferred to a photocopy exit port via transferring rollers (not shown) driven by a motor(not shown).

According to the multicolor photocopying apparatus of the present embodiment as constructed above, the original 101 is photocopied without the need to form images on a transparent intermediate film. Moreover, it is not necessary to use special optical systems to focus images on the photo-pressure sensitive sheet 115, resulting in a simplified small-scale construction with enhanced reliability.

In this embodiment, the permeability is detected in advance for various thicknesses of an original 101 and exposing time is determined depending on these measured permeabilities. Many thicknesses of original can be processed. The high tonal quality finish can be achieved independent of the thickness of original 101.

Moreover, in this embodiment, the imaged surface of original 101 is mounted on the photocopying plate 110 face-to-face with the surface of photo-pressure sensitive sheet 115. This means that the reverse image is photocopied on the photo-pressure sensitive sheet 115.

After exposure, the image is duplicated by chemical reaction with the developing agent in the orientation of the original image. In this manner, a copy of the original image is produced image-wise on the front of the sheet 115 and fine tonal quality is obtained.

Instead of mounting the original 101 face-to-face with the surface of the photo-pressure sensitive sheet 115, the original 101 can be reversely mounted from the start. In doing this, the reverse image is photocopied on the transfer sheet 125, but an image-wise photocopy is produced if the photo-pressure sensitive sheet 115 is provided with both microcapsules and developing agents to allow photocopying on exposure.

Figure 6:
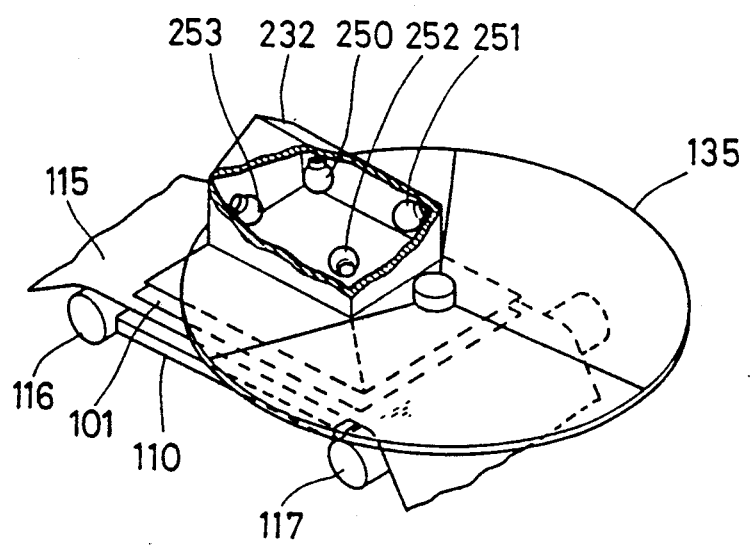
FIG. 6 is a perspective illustration of a multicolor photocopying apparatus showing the second embodiment in accordance with the present invention.

Next, a second preferred embodiment of the present invention is disclosed. The second embodiment is constructed the same as the first embodiment except for the lights. The lights of this multicolor photocopying apparatus include 4 sets of halogen lamps 250, 251, 252, 253 as shown in FIG. 6.

Figure 7:
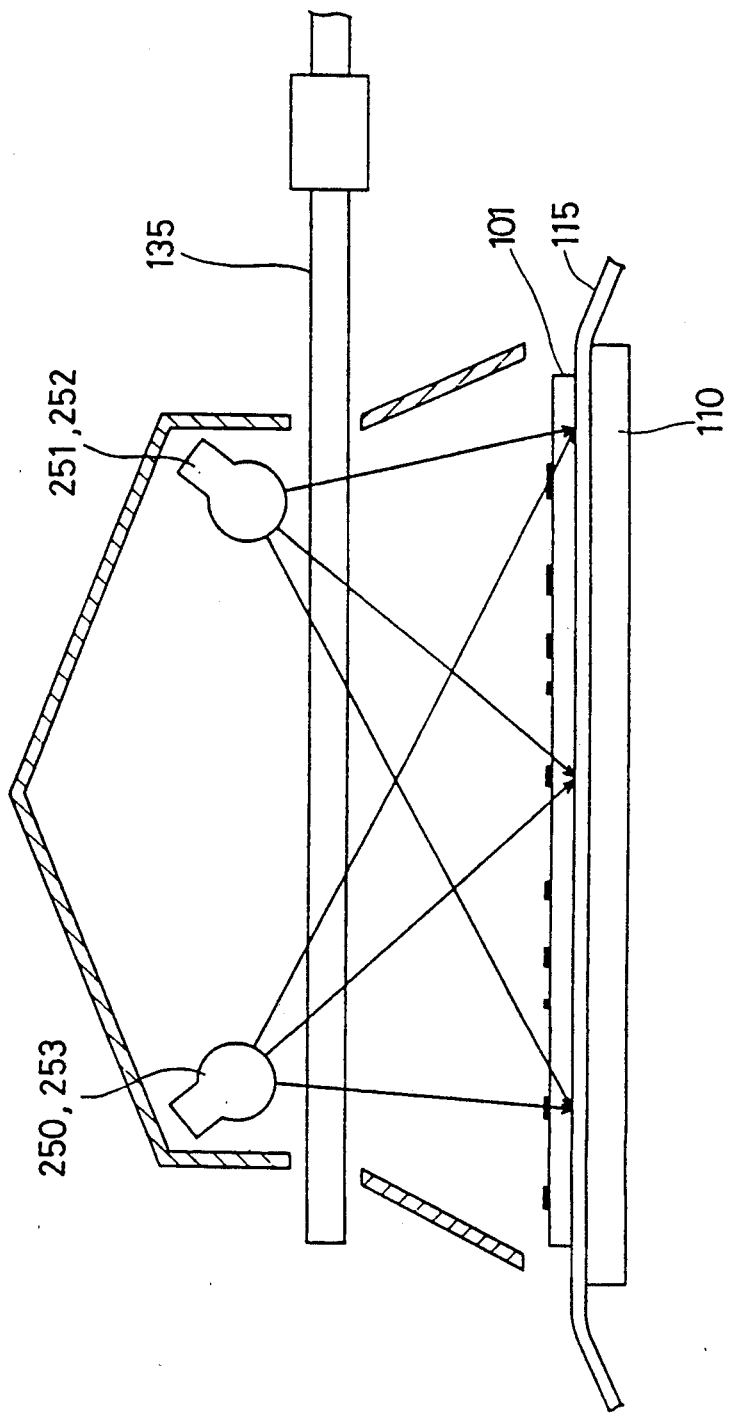
FIG. 7 is an explanatory illustration showing an exposing system of the second embodiment.

Element numbers herein assigned are given to corresponding elements of the first embodiment. The distance between lamps and the photocopying plate 110 is less than that of the first embodiment. As shown in FIG. 7, the original 101 is mounted on the front surface of photo-pressure sensitive sheet 115 facing the image thereof to the front of the sheet 115 and photocopied under comps of 250 to 253. A plurality of lamps 250 to 253 serves to avoid imaging of the reverse side of the original due to the light reflected onto images such as symbols, figures and characters drawn on the reverse side of the original 101.

Figure 8:
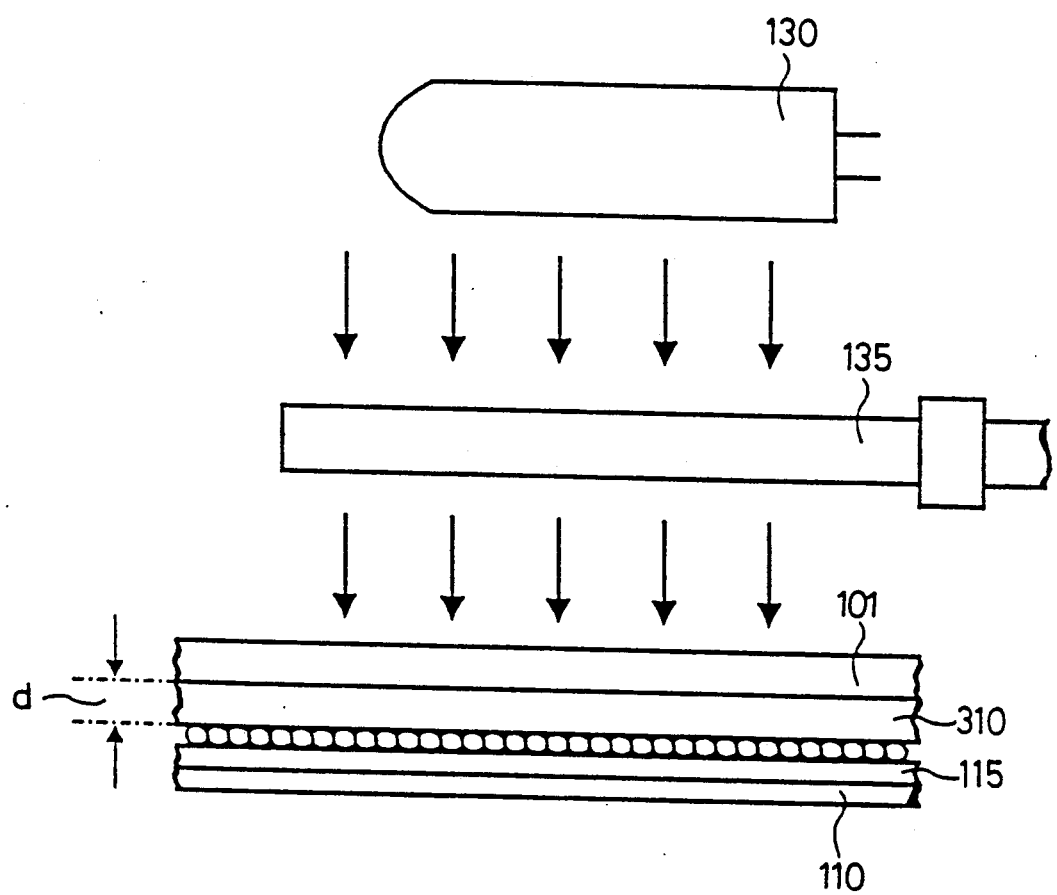
FIG. 8 is an illustration showing relative positions of a light source, a filter, an original and a photosensitive sheet of the third embodiment.

Referring to FIG. 8, a third preferred embodiment of the present invention is disclosed. The figure shows an expanded sectional illustration of multicolor photocopying apparatus shown in FIG. 1. The construction of this embodiment is the same as that of the first embodiment, except having a permeable member 310. This apparatus consists of a photo-pressure sensitive sheet supporting member 110, a photo-pressure sensitive sheet 115, the permeable member 310 and an original 101. Above the original 101 is arranged a xenon lamp 130, light from which is sent to a color resolving filter 135; the original 101 is then illuminated with the filtered light, either blue, green, or red.

Assuming that the thickness of the permeable member 310 is d and the photocopied area of the photo-pressure sensitive sheet is S, the member 310 is so constructed as to satisfy the following conditions;

$$d \leq 0.1 \text{(mm)} \text{ when } S \text{ is less than or equal to } 1.0 \times 10^4 \text{(mm}^2\text{)} \quad (1)$$

$$d \leq \sqrt{S}/10^3 \text{(mm)} \text{ when } S \text{ is greater than } 1.0 \times 10^4 \text{(mm}^2\text{)} \quad (2)$$

where, the photocopied area of photo-pressure sensitive sheet 115 is $6,250 \times 10$ mm$^2$. Therefore, the thickness of permeable member 310 is set to 0.1 mm so that the d value is less than or equal to 0.25 mm. When the permeable member 310 falls within the above range, light can be kept from being deflected as it passes through the permeable member 310 to illuminate the original image directly. The absence of deflected light contributes to form a photocopied image of high tonal quality.

The restricting conditions herein described have been determined by experiments testing how faithfully the original image is reproduced on the photo-pressure sensitive sheet. In accordance with this visual check, the relationship between the photocopied area S and the thickness d of the permeable member 310 is introduced. The permeable member 310 can be replaced by transparent glasses or transparent resin materials.

Figure 9:
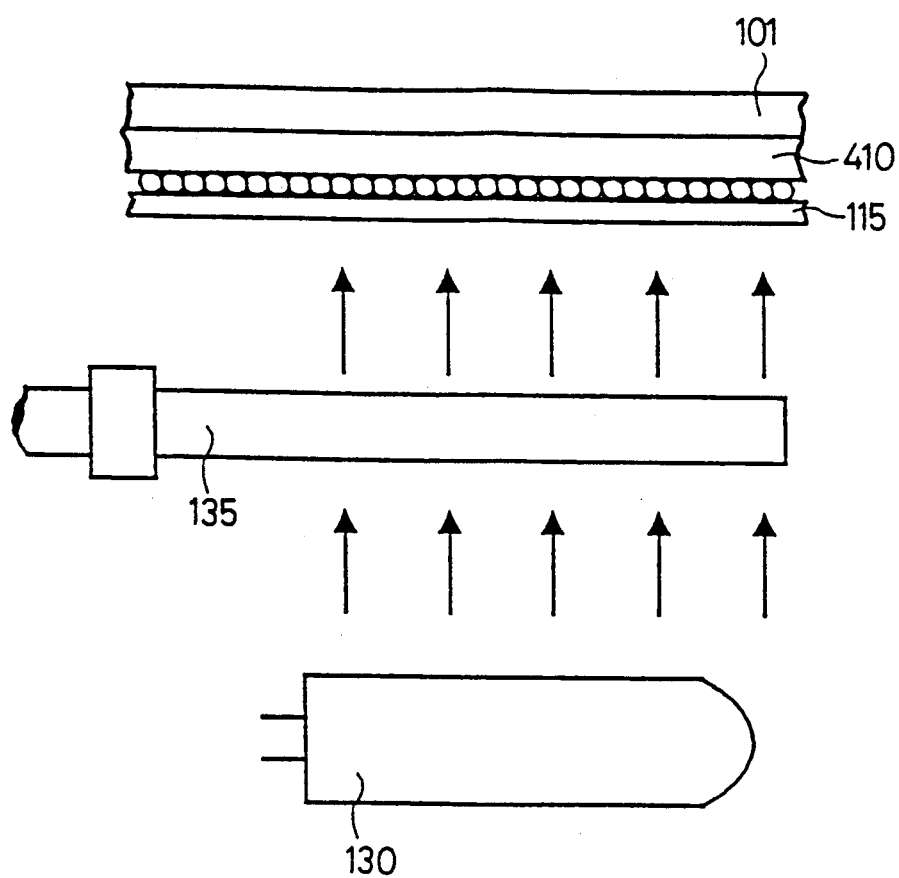
FIG. 9 is another illustration showing relative positions of a light, a filtering through an original and a photosensitive sheet of the fourth embodiment.

Next, the fourth preferred embodiment of the present invention is disclosed. FIG. 9 shows an exposing portion of the fourth embodiment, the construction of which is the same as that disclosed in the third preferred embodiment, except the exposing portion mechanism. Unlike the third embodiment in which the light 130 is transmitted into the photo-pressure sensitive sheet 115 through the original 101 and the permeable member 310, in the fourth embodiment, the light 130 reaches the original 101 through the photo-pressure sensitive sheet 115 and a permeable member 410 and is reflected by the original 101.

The photo-pressure sensitive sheet 115 is exposed to the reflected light from the original 101 through the permeable member 410(disclosed in Patent Application 62-024358).

Next, a fifth preferred embodiment of the present invention is described with reference to FIGS. 10, 11. The photo-pressure sensitive sheet described hereafter is the photo-pressure sensitive sheet corresponding to filtered colors as proposed by U.S. Pat. No. 4,399,209 specification (Published Unexamined patent application Ser. No. 58-88739).

When using another type of photo-pressure sensitive sheet, the same exposing system can be applied except for some necessary modifications for developing means.

In an innermost part of the photocopying apparatus 501, a light 519 is provided. On an upper portion of the light 519 is arranged a movable original retainer 511 to support an original S and inside which the original S is mounted. The original-retainer 511 is formed of a photo-pressure sensitive member over which is a vertically movable exposing stand 509.

On an upper part of the exposing stand 509 is disposed a tray 508. Springs 510 are arranged between said tray 508 and said exposing stand 509. On a right upper portion of the tray 508 is fixed a cassette 502 for housing a photopressure sensitive sheet 503; the photo-pressure sensitive sheet 503 is housed inside of the cassette 502. On a left side of the cassette 502 and over the tray 508 is disposed rotatably a winding roller 504. A clamp sub-arm 507 is rotatably fixed to the tray 508 between the winding roller 504 and the tray 508.

On right end of the clamp sub-arm 507 is disposed an engaging member 509a which extends upwardly from a center of the exposing stand 509 through a hole 508a drilled on the tray 508. On the left side of said tray 508 is disposed rotatably a cam gear 505. A clamp arm 506 is so arranged as to touch at its left end upon the outer periphery of a cam 520 which is integrally rotated with the cam gear 505 via an axis 505a.

The clamp arm 506 is supported rotatably at its center portion on the tray 508 and right end of the clamp arm 506 touches the left end of the clamp sub-arm 507. The cam 520, clamp arm 506 and clamp sub-arm 507 interact so as to lift the exposing stand 509 at two points away from the paper in FIG. 10.

A press roller 512 is arranged between the tray 508 and the cam gear 505. Over the press roller 512 is disposed a detaching roller 518 and further over which is disposed a thermal fixing roller 513. The photo-pressure sensitive sheet 503 underlying the tray 508 is taken out from the cassette 502 and rolled onto the winding roller 504 via the pressure-fixing roller 512 and the detaching roller 518.

Under the pressure-fixing roller 512 is arranged a transfer sheet cassette 514, inside of which is housed a transfer sheet 515, and on the upper portion of which is arranged a transferring roller 516 for taking out the sheet 515 from the cassette 514. On an upper part of the sheet cassette 514 is arranged a guide 517 for guiding the transfer sheet 515 to the pressure-fixing roller 512. The cam gear 505 is driven by a motor (not shown).

Figure 10:
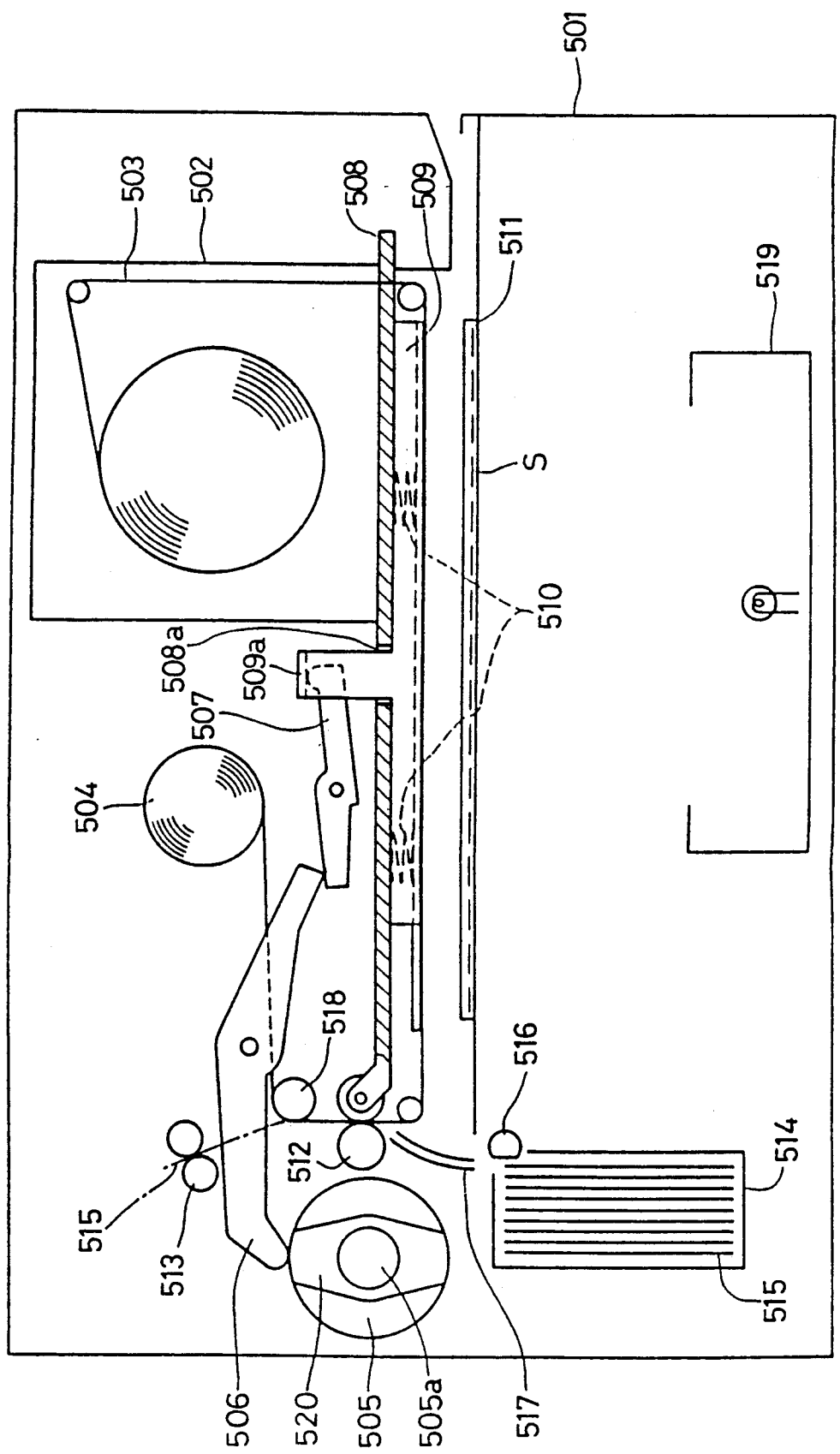
FIG.10 is a schematic illustration of a multicolor photocopying apparatus showing a fifth preferred embodiment in accordance with the present invention.

In operation, first, referring to FIG. 10, the photo-copying original S is fixed on the original retainer 511 and inserted into the photocopying apparatus 501. After the original S is inserted, the cam gear 505 is driven to rotate 90 degrees about the axis 505a, and the cam 520 is simultaneously rotated to rotate the clamp arm 506 counterclockwise.

At this time, the clamp sub-arm 507 is rotated clockwise causing the exposing stand 509 to be lowered with a spring force of the spring 510. Then, the photo-pressure sensitive sheet 503 is evenly stuck to the original retainer 11 by the spring force of the spring 510 (shown in FIG. 11).

When the original S completely contacts the photopressure sensitive sheet 503, the light 519 is lit to start exposing and form the latent image on the photo-pressure sensitive sheet 503. Upon exposure, the exposed photo-pressure sensitive sheet 503 is transferred to the press roller 512.

Figure 11:
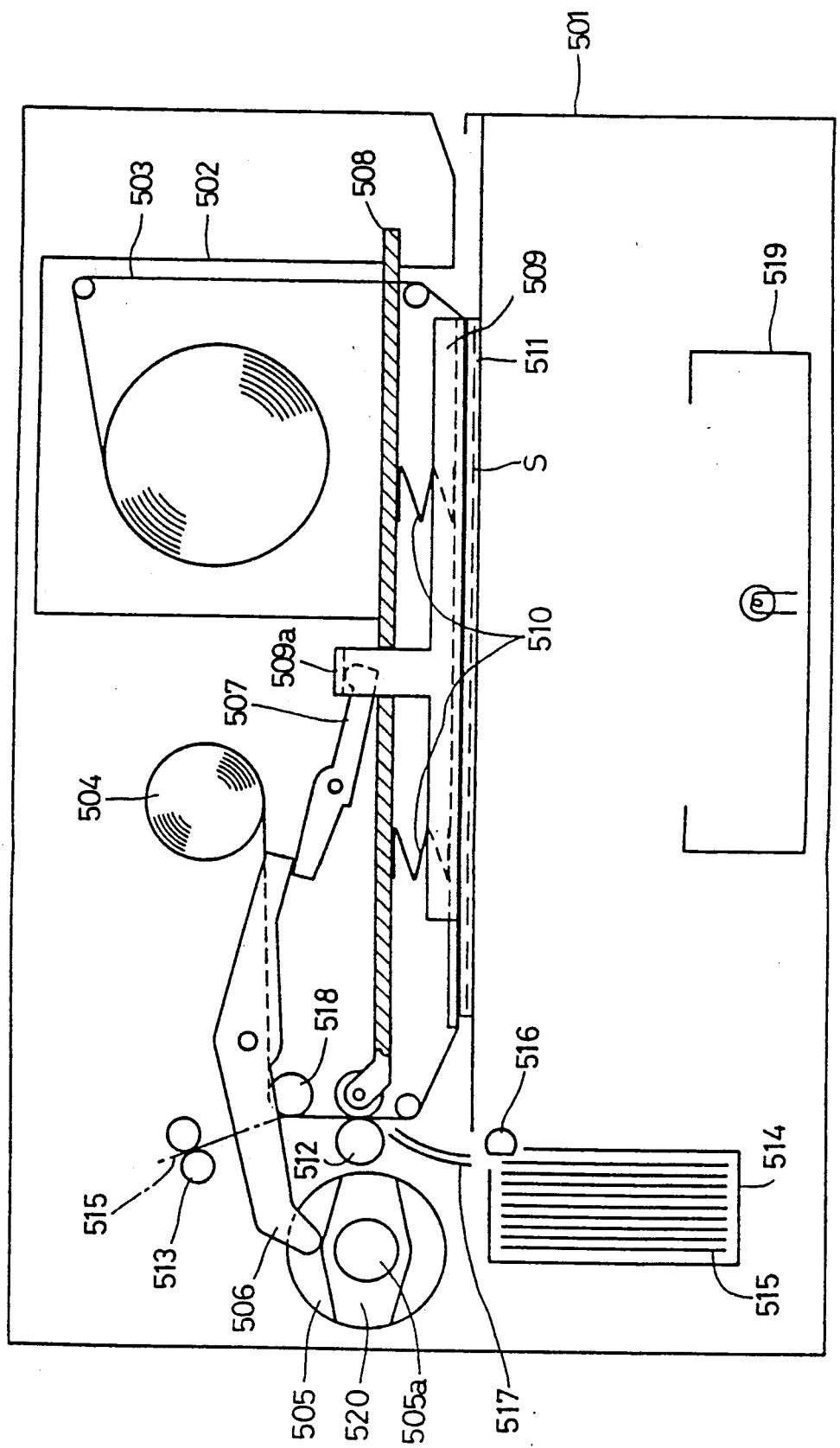
FIG. 11 is a schematic illustration showing that exposure stand is snugly overlapped in the fifth embodiment.

If the photo-pressure sensitive sheet 503 is transferred while being fixed snugly to the originals as shown in FIG. 11, the photo-pressure sensitive sheet 503 rubs along the surface of the original retainer 511 and is damaged due to friction generated therefrom. To avoid this, the cam gear 505 is again rotated 90 degrees to be located as shown in FIG. 10. Here, the clamp arm 506 is rotated to move the clamp sub-arm 507 and to raise the exposing stand 509 against spring force of the spring 510.

The exposing stand 509 to be raised against the spring force of spring 510 separates the photo-pressure sensitive sheet 503 from the original retainer 511. After this, the roll-up roller 504 is driven to move the photopressure sensitive sheet 503 on which the latent image is formed to the press roller 512.

At the same time, the transferring roller 516 is driven to take out the transfer sheet 515 from the transfer sheet cassette 514 and to overlap it onto the photo-pressure sensitive sheet 503. Then, the latent image formed on the photo-pressure sensitive sheet 503 is duplicated on the transfer sheet 515 when the photo-pressure sensitive sheet and the transfer sheet 515 are pressed together by the press roller 512. After duplication, the detaching roller 518 is rolled to detach the photo-pressure sensitive sheet 503 from the transfer sheet 515 which is treated with fine coloring of high tonal quality through the thermally fixing roller 513 and discharged from the photo-copying apparatus 501.

Figure 12:
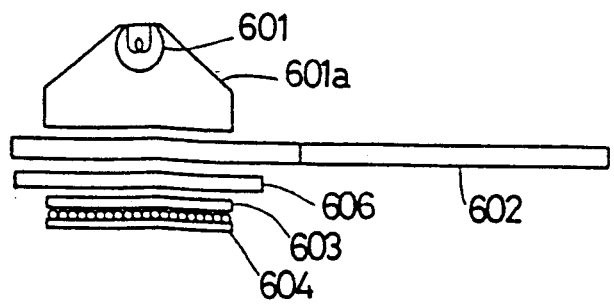
FIG. 12 is a side illustration of a sixth embodiment in accordance with the present invention.
Figure 13:
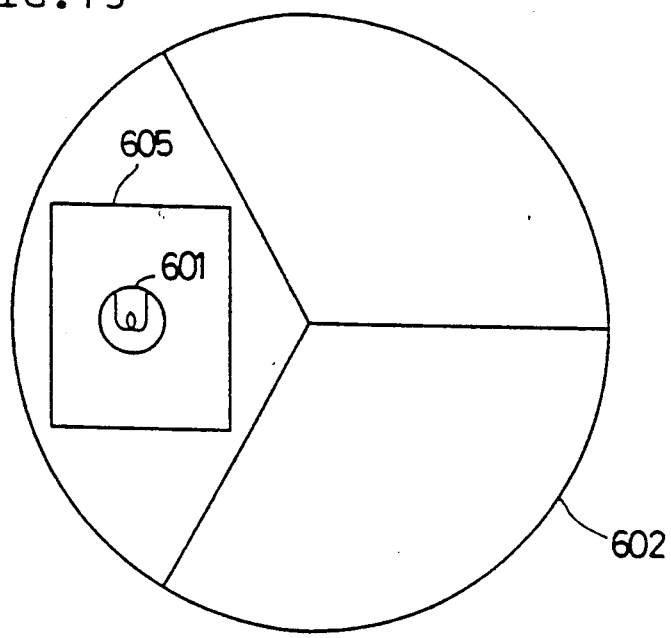
FIG. 13 is a plan view of FIG. 12.
Figure 14:
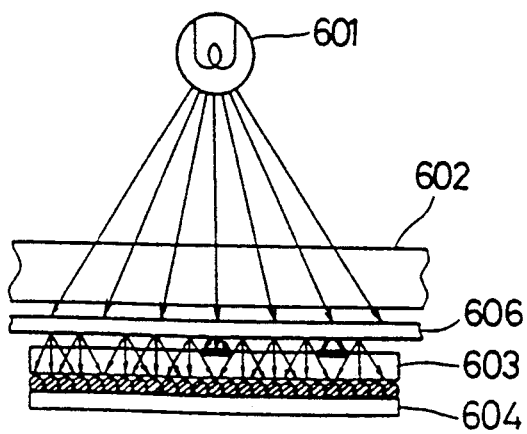
FIG. 14 is an illustration showing functional behavior of FIG. 12.
Figure 15:
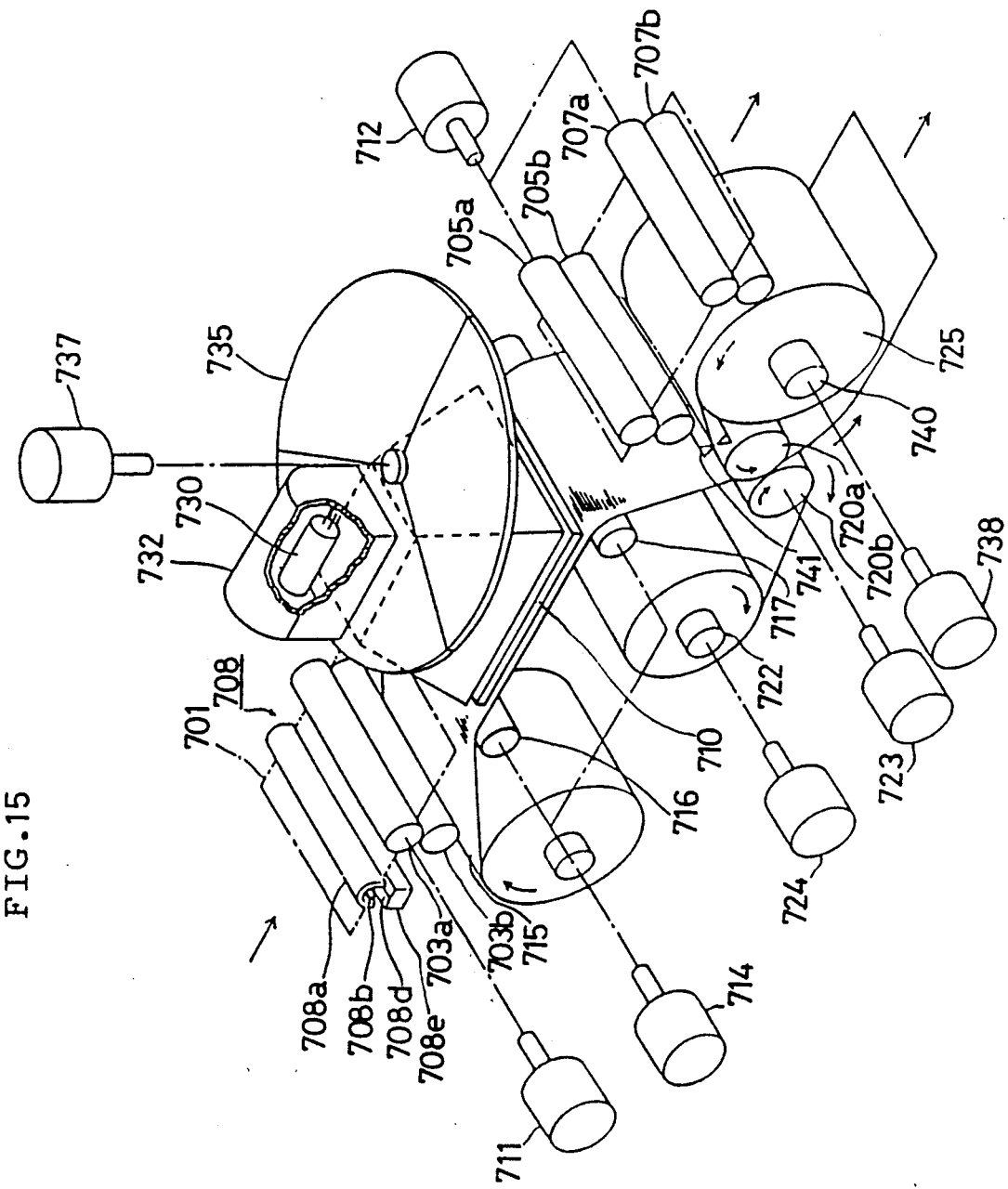
FIG. 15 is a partially perspective illustration showing a general construction of photocopying apparatus of the seventh preferred embodiment; in accordance with the present invention.

Next, a sixth preferred embodiment of the present invention is explained with reference to FIG. 12 to 14. The construction of this embodiment is the same as that of the first preferred embodiment except for the exposing part. In this embodiment, the photo-pressure sensitive sheet 604 is pressed by rollers. In this case, the microcapsules carried on the photo sensitive sheet 604 which have not been exposed to light and not cured are ruptured by pressure. A chromogenic material effuses from the ruptured microcapsules and chemically reacts with developing agents coated on the transfer sheet to form an image on the transfer sheet (disclosed in patent application Ser. No. 62-13138).

Over an upper part of the photo-pressure sensitive sheet 604 is arranged a light box 601a housing a xenon lamp 601 for exposure. White light emitted from xenon lamp 601 is resolved into one of either blue, green, red by a color resolving filter 602 and shined onto an original 603 to be photocopied. The original 603 is snugly fit onto the upper surface of the photo-pressure sensitive sheet 604 and the lamp 601 illuminates the original 603. A light diffusing plate 606 is arranged between the original 603 and the filter 602. This light diffusing plate 606 can be replaced by, for example, permeable but not transparent materials such as glass and plastic film, etc.

In operation, light emitted from the lamp 601 is resolved into a specific color such as red by filter 602, and applied onto the light diffusing plate 606. Light impinging on the diffusing plate 606 is diffused over the original 603 and applied on the reverse side of the original 603. Some part of this light passes through an original retainer(not shown). Being diffused, light is directed across the center area of coloring stage of original 603 as shown in FIG. 14, including that area occupied by characters on the reverse side of the original 603.

Light is resolved into three different colors in accordance with revolving filter. After one color, red for example, is radiated through the red filter, it irradiates only the colored area containing red components and not into other colored areas containing for example blue, green, or cyan color. When red light passes through the coloring stage to expose the photo-pressure sensitive sheet 604 snugly fit against the colored original 603, cyan microcapsules are cured. The yellow and magenta microcapsules are not cured. During development, these uncured microcapsules become red. Similarly, when the lights are filtered through the green and blue filter, microcapsules are developed to reproduce a colored image of the original.

Next, a seventh preferred embodiment of the present invention is explained. Referring to FIG. 15 through 20, the photocopying apparatus of this preferred embodiment is furnished with 3 sets of transferring rollers 703a, 703b, 705a, 705b, 707a, 707b to transfer a multicolored original 701 such as a colored picture. The original 701 to be photocopied is transferred from the original insertion port (not shown) via a permeability detection sensor 708 to the lower part of a liquid crystal display panel 710 which serves also as the photocopying stage.

After photocopying, the original 701 is transferred further to an original roll-out port. At fore and aft of the liquid crystal display panel 710 through which the original 701 is transferred are provided paper transferring rollers 716, 717 driven by a motor 714 to transfer a photo-pressure sensitive sheet 715. The original 701 and the photo-pressure sensitive sheet 715 are snugly fit and transferred together under the liquid crystal panel 710. A glass plate (not shown) framing the liquid crystal panel 710 is connected to a static electric generator (not shown) which generates minute static electricity to tightly draw and bind together the original 701 and photo-pressure sensitive sheet 715.

Figure 16:
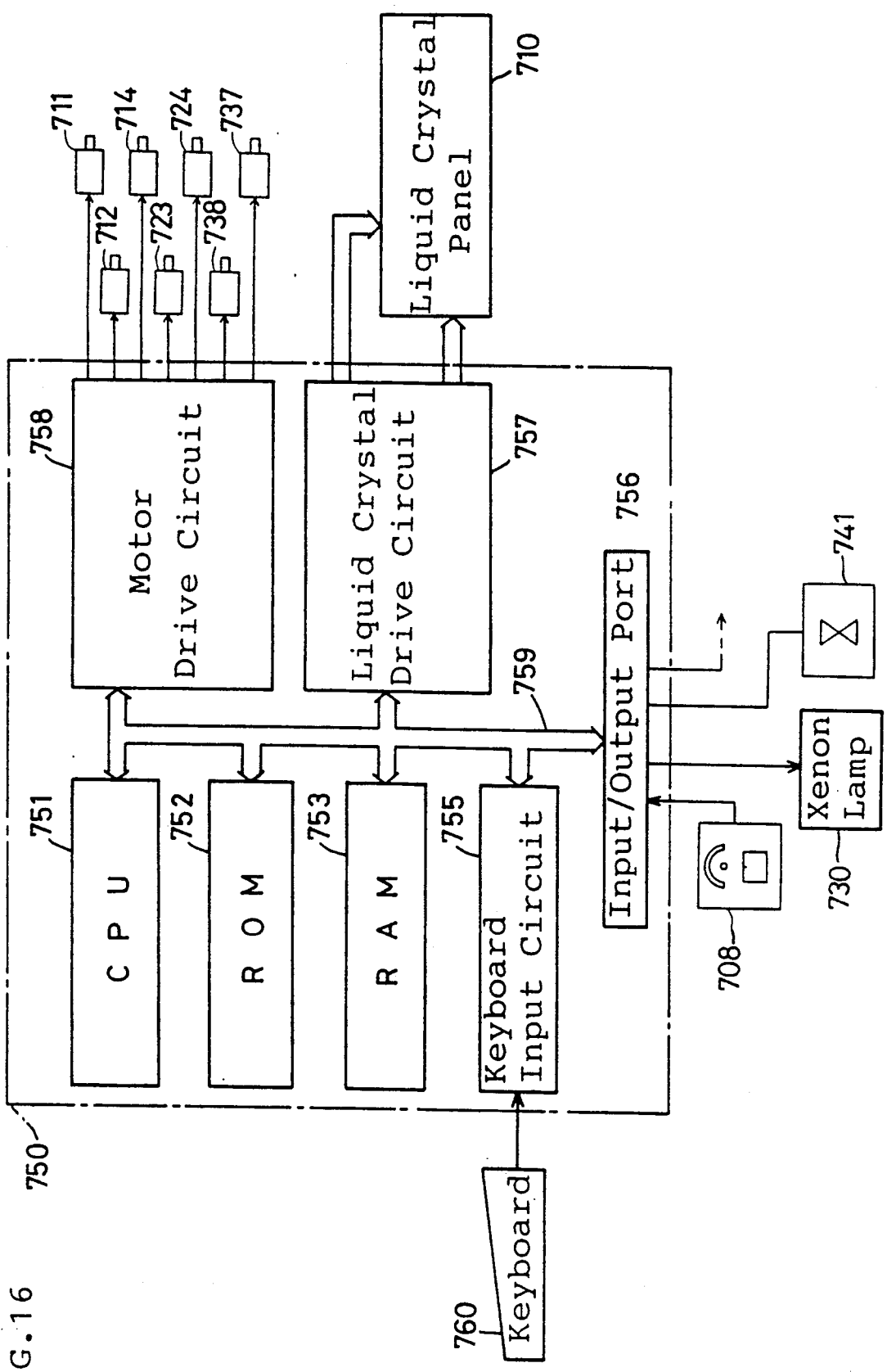
FIG. 16 is a block diagram showing an electrical system of the seventh embodiment.
Figure 17A:
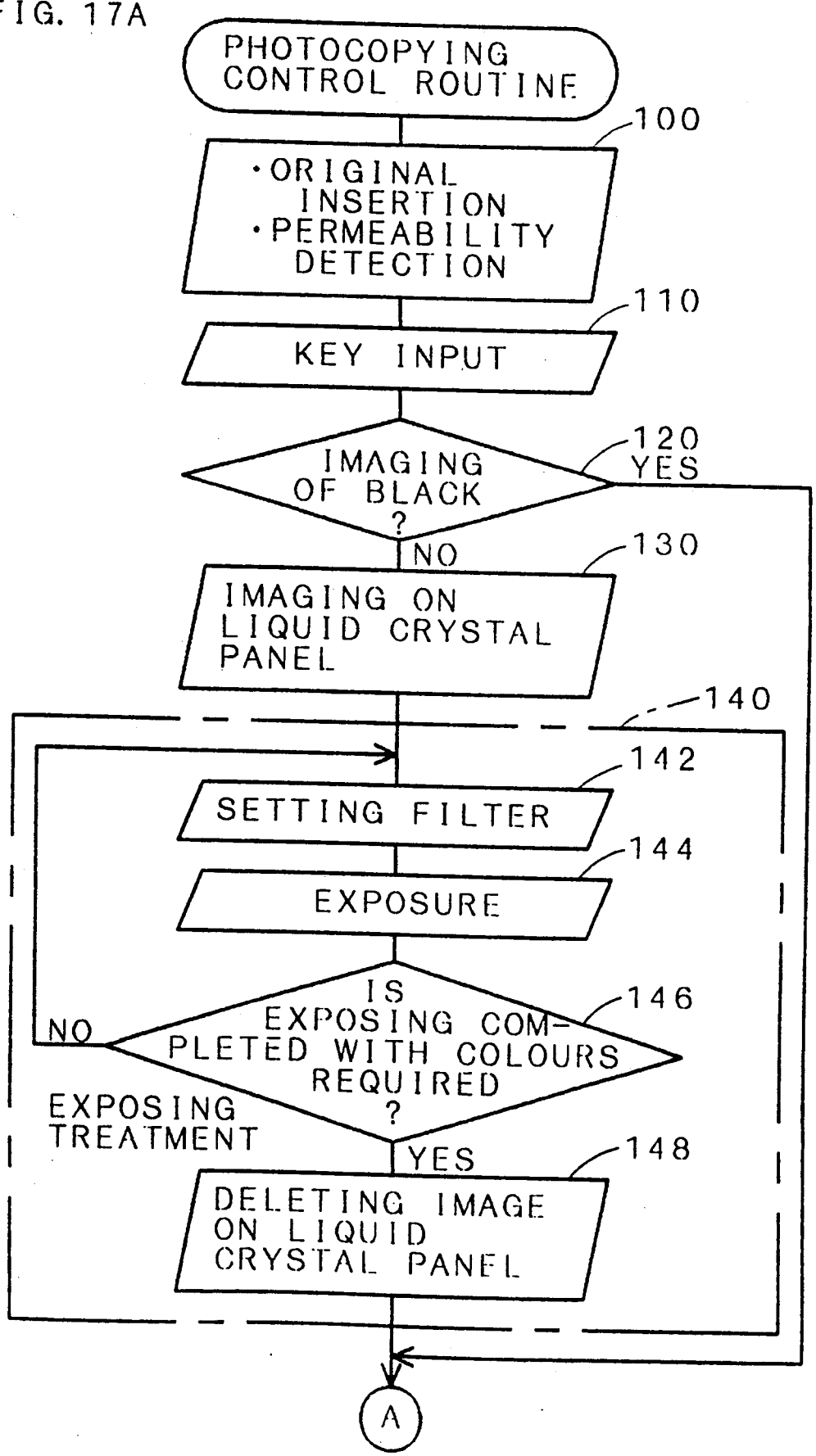
FIGS. 17 A,B are flow charts showing a photocopying control routine of the seventh embodiment.
Figure 17B:
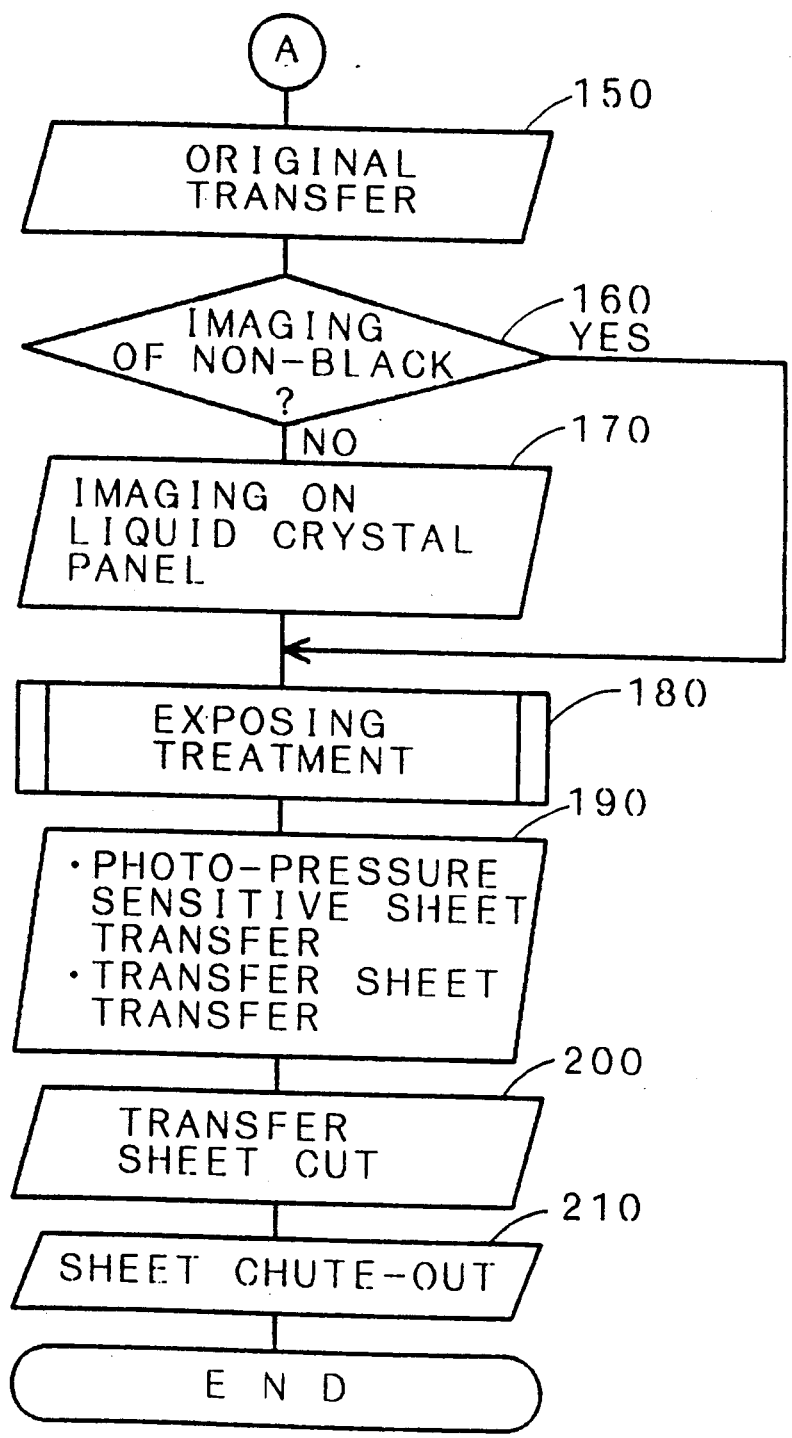

Further, the permeability sensor 708, liquid crystal panel 710, various types of motors 711, 712, 714, 723, 724, 737, 738, xenon lamp 730, and electric cutter 741 are all connected to the electronic control unit 750 shown in FIG. 16 (hereafter called ECU) and controlled thereby. The ECU 750 is constructed as the operational logic circuit which includes mainly well known CPU751, ROM752 and RAM753 where a keyboard input circuit 755, an input/output port 756, a liquid crystal panel drive circuit 757 and a motor drive circuit 758 are interconnected via a bus line 759. The keyboard input circuit 755 is connected with a keyboard 760 having keys corresponding to characters, symbols, figures. These input data can be entered from the keyboard 760 into CPU751.

To the input/output port 756 is connected the permeability detection sensor 708, the xenon lamp 730, an electric cutter 741 or a static electric generator not shown. Accordingly, the CPU 751 can detect the permeability of original 701 through the input/output port 756 and control the flickering of xenon lamp as well as the cutting of a transfer sheet 725 to specific size by the electric cutter 741. The liquid crystal drive circuit 757 is used to drive the liquid crystal panel 710 with duty and to form an image at a required position of the liquid crystal panel 710 in dot matrix configurations showing characters and figures by keying the input key board 760.

The motor drive circuit 758 is connected to motors as previously described. The CPU751 can control transfer of the original 701 in and out of the apparatus, transfer of photo-pressure sensitive sheet 715, and revolution of the filter 735 through the motor drive circuit 758.

In operation, the thermally fixed color picture as original 701 is inserted from the original insertion port to begin photocopying. The ECU 750 starts the photocopying control routine shown in flow chart in FIG. 17(A)(B).

First, the motor 711 is driven to transfer the original 701 ahead till the liquid crystal panel 710, and the permeability detection sensor 708 detects the permeability of the original 701(step 100). The exposing time is determined by the permeability as detected by the permeability sensor 708 when the light is projected through the non-image portion (the portion where no image appears on the imaged surface of the original 701). Depending on this permeability, the exposing time Tb for the three filtered colors can be determined.

Another method for determining exposing time for three filtered colors is to infer the same by detecting the permeability to white projected on the non-image portion of original. Still another method for determining permeability is to use the same filter as the filter 735 and infer permeability to each of the three colors blue, green, red. Next, data are entered from keyboard 760 (step. 110). These data include designations of only additional characters to be imaged and where white imaging or non-black imaging; and trimming configurations such that an original image can be diversified.

Figure 18C:
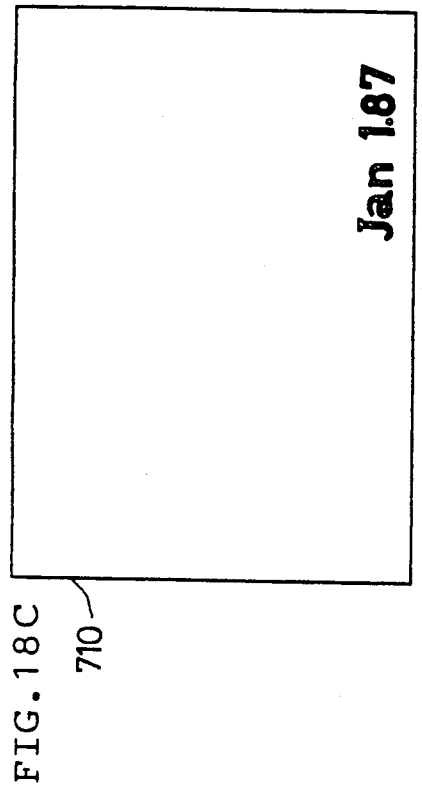
FIGS. 18 A,B,C,D are explanatory illustrations respectively showing images displayed on a liquid crystal display of the seventh embodiment.
Figure 18D:
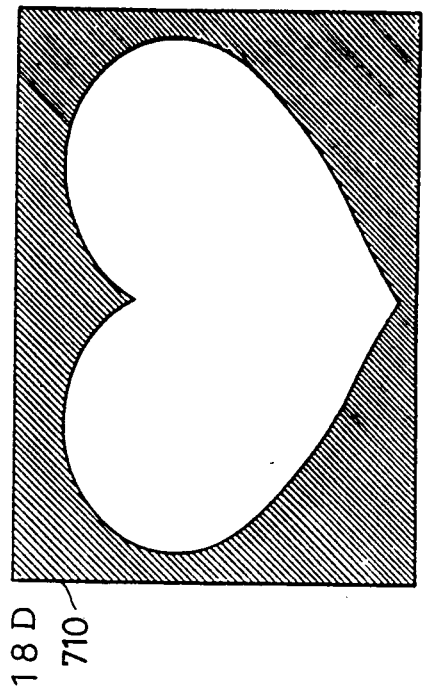
Figure 18A:
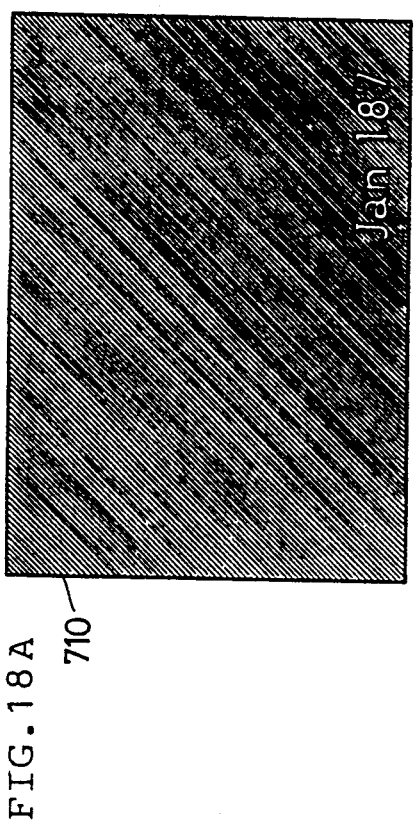
Figure 18B:
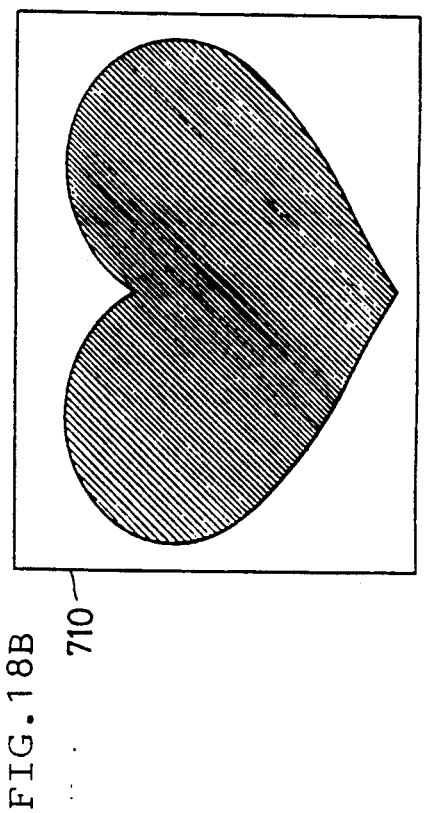

On entry of these data, it is judged whether or not black area is designated(step 120). When other area than black one is designated,(white area without color), steps down 130 and down are executed and pretreatment is performed. The pretreatment is made before the original 701 is transferred under the liquid crystal panel 710, and the images to be added are formed on the liquid crystal panel 710 depending on the data entered in step 110. These images can be added by using this liquid crystal panel 710 in such a manner that specific images such as those shown in FIG. 18(A), are reproduced in a different character color. In FIG. 18(A), the character showing date "Jan. 1,87" is not reproduced from image.

Figure 19A:
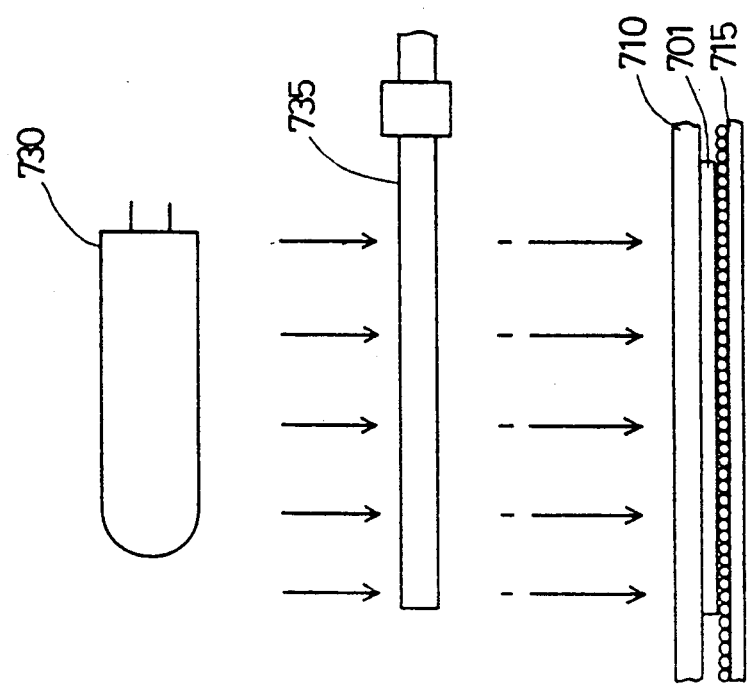
FIGS. 19 A,B are illustrations showing relative positions of a liquid crystal panel, an original and a photosensitive sheet of the seventh embodiment.
Figure 19B:
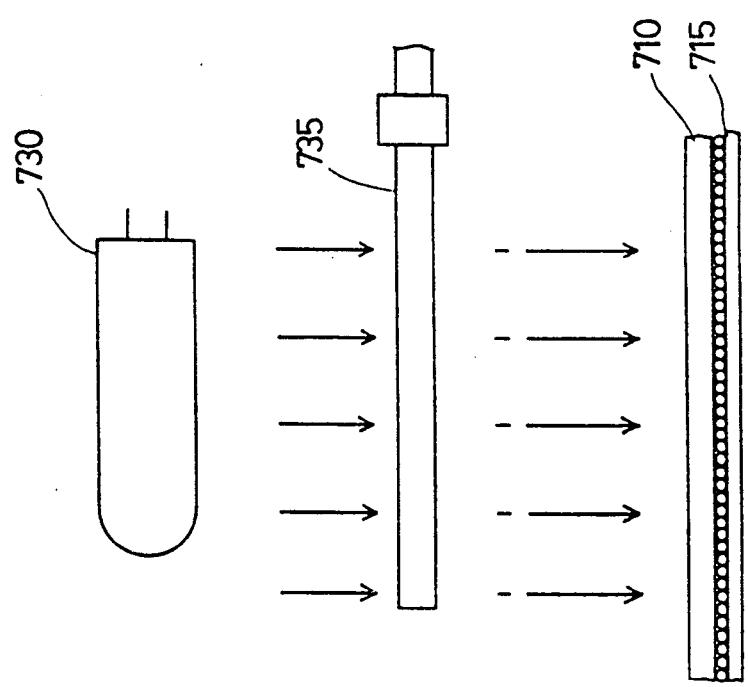

As another example shown in the same figure (B), a heart shape can be reproduced. The slashed lines in FIG. 18(A) and (B) correspond to the part on the liquid crystal panel 710 through which the light is not radiated. Next, the exposing treatment is executed(step 140). At this time, it is only the photo-pressure sensitive sheet 715 that is stuck by static electricity up under the liquid crystal panel 710 as shown in FIG. 19(A). According to this embodiment, the original 701 is shown mounted face-to-face in image-wise direction with the photo-pressure sheet 715. The exposing is made in the following order;

(a) First, the motor 737 is driven to rotate the filter 735 into a position so that an area of the original 701 to be reproduced is located right under an original color filter (step 142). When reproducing only the red of the original, the red portion of filter 735 is set in position.

(b) Then, the xenon lamp 730 is lit and exposing starts(step 144). In this case without the original 701, exposing lasts less than 1 second. If the red portion of filter 735 is set in position, the red color is projected onto the non-imaged portion of liquid crystal panel 710 -that is, a controllable unit of crystal cells-and then penetrates down to the photopressure sensitive sheet. In response to light, microcapsules having maximum photo-polymerization in reaction to a microwavelength of approximately 650 nm (cyan microcapsule) are cured to acquire increased mechanical strength.

Next, it is judged whether or not the areas of the desired color in the original have been completely exposed (step 146). If exposing is not completely done, steps 142 to 146 are repeated. To reproduce red of the original, only the red portion of filter 735 is exposed. For reproduction of white portions, exposing is done three times by using three colors; blue, green, red. This means that all of capsules, cyan, magenta, yellow, corresponding to the non-imaged areas of liquid crystal panel 710 are not cured when exposed to white. This simultaneous exposure occurs only once while rotating the filter 735. Then, the image on the liquid crystal panel 710 is removed (step 140) and exposing treatment (step 140)is completed to move on to the steps after 150.

On the other hand, when extracting images on the original 701 with the image on the liquid crystal panel 710, that is, reproducing non-slashed block of the original, it is not necessary to do pretreatment. Steps are skipped directly from 120 to 150. At step 150, the original 701, which has already been transferred up till the liquid crystal panel 710, is further transferred down under the liquid crystal panel 710. At this time, the photo-pressure sensitive sheet 715 is released from the tight static electricity bond onto the liquid crystal panel 710 and readhered after transfer. This state of operation is shown as one model for explanation in FIG. 19(B). Next, it is judged whether or not the combined image for photocopying is white imaging, i.e, reproducing of original's white (step 160).

In case of non-black extraction, the image formed in step 130 is formed in negative on the liquid crystal panel 710 (step 170). When reproducing white portions, the step executed is for exposing treatment without forming the image appearing in the liquid crystal panel 710.

In this step where non-black images in the original are extracted in non-black imaging, the original image is not reproduced because microcapsules on the photo-pressure sensitive sheet 715 are cured in exposure to white in the previous steps.

When reproducing in colors other than white, the image is formed in negative to avoid curing of microcapsules by exposure. These microcapsules were not cured in previous steps during pretreatment and should not be cured this time over portions to be reproduced in black and other colors. In contrast with the black images shown in FIG. 18(A) and (B), the corresponding negative images are shown in the figures (C) and (D) which white portions are formed as if light was totally shielded from them.

The exposing treatment(step 180) is nearly the same as that in pretreatment (step 140) with the only exception that the exposing time Tb differs depending on exposing colors. The exposing time is as previously described determined by permeability of the original 701. According to this embodiment, the exposing time is approximately 8 seconds for red, and 4 seconds for both blue and green. The exposing time Tb differs depending on exposing colors, because the color types of microcapsules are constructed differently. The exposing time can be arbitrarily determined by a combination/selection of photo-curing resin and polymerizing initiator.

Moreover, during the 3 exposures, the original 701 and the photo-pressure sensitive sheet 715 are tightly held by static electricity onto the liquid crystal panel 710 and not displaced during exposure. After complete exposure, the photo-pressure sensitive sheet 715 is released from its static electricity bond and transferred by motors 723, 724. In synchronization with these motors, the motor 738 is rotated to roll out the transfer sheet 725(step 190).

At this time, the original 701 is transferred with the photo-pressure sensitive sheet 715. When the photo-pressure sensitive sheet 715 is moved toward press rollers 720a, 720b via the paper transferring roller 717, the more rigid original separates from the photo-pressure sensitive sheet 715.

After separation, the original 701 is transferred toward transferring rollers 705a, 705b, and is rolled out into the original chute-out port via transferring rollers 705a, 705b, 707a, 707b.

On the other hand, the transfer sheet 725 rolled out synchronously with the rolling-up of photo-pressure sensitive sheet 715 is transferred into press rollers 720a, 720b. As a result, the photo-pressure sensitive sheet 715 and the transfer sheet 725 firmly contact each other and are pressed simultaneously between press rollers 720a, 720b. When pressed, the uncured microcapsules on photo-pressure sensitive sheet 715 are ruptured and the chromogenic material effuse from them. The developing agents coated on the transfer sheet 725 chemically react with this choromogenic material to develop colored images on the transfer sheet 725.

After the transfer sheet is rolled out for a certain length, the cutter 741 is driven to cut the transfer sheet(step 200). The piece cut from the transfer sheet is transferred by transferring rollers (not shown) to a photocopying chute-out port(step 210). Following the photocopying control routine as previously described, the images are combined as shown in FIG. 20(A),(B)and (C). By replacing images formed by figures, characters, and symbols with white, the image is formed in the liquid crystal panel 710 during the process of pretreatment.

The exposing is done for three different colors to cure the three types of microcapsules (see FIG. 20(A)). In this figure, the microcapsules are marked Ⓨ, Ⓜ, Ⓒ respectively for the three different colors and the cured microcapsules are indicated by letters. On the other hand, when the image is replaced with red, the exposing is done with red during the process of pretreatment as shown in FIG. 20(B),and the photocopying exposing is done on the reflected image in the liquid crystal panel 710. Further, when reproducing images of black or imaging black characters, pretreatment can be eliminated. In this case, images corresponding to combined images are formed as shown in FIG. 20(C) in the liquid crystal panel 710 without photocopying exposure.

Next, the eighth preferred embodiment of the present invention is explained with reference to FIG. 21. This embodiment is constructed the same as the first preferred embodiment except for the exposing part.

In this embodiment, lights L1 and L2 are lit to radiate an original 801 through a liquid crystal panel 810. The reflected light from the original 801 passes through a filter 835 and an optical member and then illuminates a photo-pressure sensitive sheet 815. The images combined on the liquid crystal panel 810 are radiated and focused on the photo-pressure sensitive sheet 815 through the filter 835.

What is claimed is:
1. A multicolor photocopying apparatus comprising:
 exposure means for exposing a photo-pressure sensitive sheet to a light passing through a colored original, said sheet carrying uniformly at least two kinds of microcapsules thereon, each kind of said microcapsules having therein a chromogenic material chemically reactive with a developing agent and a photo sensitive material which changes mechanical strength of said microcapsule by absorption of said light;

developing means for developing an image on a photo-pressure sensitive sheet for a transfer sheet having said developing agent by rupturing said microcapsules of low mechanical strength among said microcapsules and by having said chromogenic material chemically react with said developing agent on said photo-pressure sensitive sheet or said transfer sheet, said original being fit on said sheet through a permeable member;

said exposure means comprising:

a cam rotatable about a shaft;

a clamp arm swingable about an axis and contacting said cam at one end thereof;

a clamp sub-arm swingable about an axis and contacting another end of said clamp arm at one end thereof;

an exposure bed supported on another end of said clamp sub-arm;

a tray supporting said exposure bed movably; and elastic members inserted between said exposure bed and said tray.

2. A multicolor photocopying apparatus, comprising:

exposure means for passing visible light from a light source through a colored original carrying an image of a plurality of colors on one side which is different than an image on an opposite side thereof and for exposing a photo-pressure sensitive sheet to the light which has been passed through the original, the sheet having a coating on at least one surface thereof, the coating containing at least two kinds of microcapsules, the microcapsules having therein a chromogenic material and a photo sensitive material which changes the mechanical strength of the microcapsules by absorption of the light;

the exposure means including a measuring means for measuring a permeability of the original by measuring the light which has been passed through the original, and a controlling means for controlling an amount of the exposure in accordance with both the permeability and an exposure characteristic of the microcapsules of the photo-pressure sensitive sheet; and developing means for rupturing the microcapsules of low mechanical strength among the microcapsules and for having the chromogenic material of the ruptured microcapsules chemically react with a developing agent on the photo-pressure sensitive sheet or a transfer sheet to develop an image on the photo-pressure sensitive sheet or the transfer sheet.

3. The apparatus as defined in claim 2, wherein said developing means is structured to develop said image on a sheet on which said microcapsules have therein a photo-polymerization starting agent besides said chromogenic material and said photo sensitive material.

4. The apparatus as defined in claim 2, wherein said developing means is structured to develop said image on a sheet on which said transfer sheet is coated with said developing agent.

5. The apparatus as defined in claim 2, further comprising means for controlling an amount of said light passing to said photo-pressure sensitive sheet according to images on said original.

6. The apparatus as defined in claim 5, wherein said means for controlling the amount of said light passing to said sheet is a liquid crystal panel.

7. The apparatus as defined in claim 2, further comprising light filtering means for filtering said visible light into a light having at least one color filtered therefrom before said light passes through said original.

8. A multicolor photocopying apparatus according to claim 2, wherein an exposure time for green and blue microcapsules is less than that of red microcapsules.

9. A multicolor photocopying apparatus according to claim 2, wherein an exposure time is determined by a combination and selection of the photo-curing resin and the photo-polymerization initiator.

10. The apparatus of claim 2, wherein the image on the opposite side of the original is blank.

11. A multicolor photocopying apparatus according to claim 2, further comprising
a permeable member for fitting between said original and said sheet.

12. The apparatus as defined in claim 11, wherein said exposure means has a means for changing a clearance between said original and said photo-pressure sensitive sheet.

13. The apparatus as defined in claim 11, further comprising light filtering means for filtering said visible light into a light having at least one color filtered therefrom before said light passes through said original.

14. A multicolor photocopying apparatus according to claim 2, further comprising
means between the original and a source of the light, for diffusing the light, the visible light passing from a front surface of the original and to a back surface of the original, wherein images on the front surface are not exposed on the photo-pressure sensitive sheet or the transfer sheet.

15. The apparatus as defined in claim 14, further comprising light filtering means for filtering said visible light into a light having at least one color filtered therefrom before said light passes through said original.

16. A multicolor photocopying apparatus according to claim 2, wherein
the exposure means includes:
a permeable member, wherein at $S \leq 1.0 \times 10^4$ mm$^2$, $d \leq 0.1$ mm and at $S > 1.0 \times 10^4$ mm$^2$, $d \leq \sqrt{S}/10^3$ mm wherein S represents a photocopied area of the photo-pressure sensitive sheet, and wherein d represents a thickness of the permeable member;

fitting means for fitting eh original on the photo-pressure sensitive sheet through the permeable member during exposure; and means between the original and a source of the light for diffusing the light.

17. The apparatus as defined as in claim 16, wherein said means for diffusing and permeating said light is made of a glass or plastic film having a characteristic for permeating a light therethrough but not being transparent.

18. The apparatus as defined in claim 16, further comprising light filtering means for filtering said visible light into a light having at least one color filtered therefrom before said light passes through said original.

19. A multicolor photocopying apparatus according to claim 2, wherein the amount of the exposure is controlled by changing a time of the exposure.

20. The apparatus as defined in claim 19, further comprising light filtering means for filtering said visible light into a light having at least one color filtered therefrom before said light passes through said original.

21. A multicolor photocopying apparatus, comprising:
exposure means for passing visible light from a light source through a colored original carrying an image of a plurality of colors on one side which is different than an image on an opposite side thereof and for exposing a photo-pressure sensitive sheet to the light which has been passed through the original, the sheet having a coating on at least one surface thereof, the coating containing at least two kinds of microcapsules, the microcapsules having therein a chromogenic material and a photo sensitive material which changes the mechanical strength of the microcapsules by absorption of the light;
the exposure means including a measuring means for measuring a permeability of the original by measuring the light which has been passed through the original, and a controlling means for controlling an amount of the exposure in accordance with both the permeability and an exposure characteristic of the microcapsules of the photo-pressure sensitive sheet; and
developing means for rupturing the microcapsules of low mechanical strength among the microcapsules and for having the chromogenic material of the ruptured microcapsules chemically react with a developing agent on the photo-pressure sensitive sheet or a transfer sheet to develop an image on the photo-pressure sensitive sheet or the transfer sheet,
wherein the exposure means includes means for changing a clearance between the original and the photo-pressure sensitive sheet comprising:
an exposure bed for placing the photo-sensitive sheet;
a tray movably supporting the exposure bed;
an elastic member inserted between the exposure bed and the tray; and
an actuator engaging the exposure bed and moving in a substantially reciprocating manner, the actuator containing the elastic member for storing and releasing spring energy which biases the exposure bed, thereby moving the photo-pressure sensitive sheet and the exposure bed reciprocatingly between the original and the tray.

22. The apparatus as defined in claim 21, wherein said exposure means has a means for changing a clearance between said original and said photo-pressure sensitive sheet.

23. The apparatus as defined in claim 21, further comprising light filtering means for filtering said visible light into a light having at least one color filtered therefrom before said light passes through said original.

24. The apparatus of claim 21, wherein the image on the opposite side of the original is blank.

25. A multicolor photocopying apparatus, comprising:
exposure means for exposing a photo sensitive sheet to a light passing through an original carrying an image of a plurality of colors on one side which is different than an image on an opposite side thereof, said exposure means having a means for changing a clearance between said original and said photo sensitive sheet; and
developing means for developing an image on said photo sensitive sheet.

26. The apparatus as defined in claim 25, wherein said means for changing a clearance between said original and said photo sensitive sheet comprises:
means for overlapping said photo sensitive sheet and said original during exposure; and
means for releasing said photo sensitive sheet and said original before and after exposure.

27. A method for producing a multicolor copy of an original, comprising:
passing visible light from a light source through a colored original carrying an image of a plurality of colors on one side which is different than an image on an opposite side thereof and exposing a photo-pressure sensitive sheet to the light which has been passed through the original, the sheet having a coating on one surface thereof, the coating containing at least two kinds of microcapsules, the microcapsules having therein a chromogenic material and a photo sensitive material which changes mechanical strength of the microcapsules by absorption of the light;
measuring a permeability of the original by measuring the light which has passed through the original and controlling an amount of the exposure in accordance with both the permeability and an exposure characteristic of the microcapsules of the photo-pressure sensitive sheet; and rupturing the microcapsules of low mechanical strength among the microcapsules and having the chromogenic material of the ruptured microcapsules chemically react with a developing agent on the photo-pressure sensitive sheet or a transfer sheet to develop an image on the photo-pressure sensitive sheet or the transfer sheet.

28. The method of claim 27, wherein the image on the opposite side of the original is blank.

29. The method of claim 27, wherein said microcapsule further has therein a photo-polymerization starting agent besides said chromogenic material and said photo sensitive material.

30. The method of claim 27, wherein said transfer sheet is coated with said developing agent.

31. The method of claim 27, wherein the amount of light passing to said sheet is controlled according to images on said original.

32. The method of claim 27, further including adjusting exposure time of said sheet based on the amount of light passing through said original.

33. The method o claim 27, wherein said original is directly fit on said sheet during exposure.

34. The method of claim 27, wherein a permeable member is fit between said original and said sheet.

35. The method of claim 27, wherein said light is diffused and permeated between said original and a source of said light.

36. The method of claim 27, further comprising the step of filtering said visible light so that said filtered light has at least one visible color filtered therefrom before said light passes through said colored original.

37. A multicolor photocopying apparatus comprising:
a photo-pressure sensitive sheet in the form of a web, the sheet carrying uniformly at least two kinds of microcapsules thereon, each kind of microcapsules being sensitive to light of a predetermined wavelength and having a chromogenic material chemically reactive with a developing agent and photosensitive material which changes the strength of the microcapsules by absorption of the light;

an exposure means for exposing an optical image light on the photo-pressure sensitive sheet, the optical image light being obtained by passing visible light from a light source through a colored original carrying an image of a plurality of colors on one side which is different than an image on an opposite side thereof, the light containing a plurality of predetermined wavelengths, the exposure means including a plurality of changing means for changing over the passing and shielding of light permeating in dot units;

a transfer sheet in the form of a cut sheet having the developer agent;

a developing means for superposing the exposed photo-pressure sensitive sheet and the transfer sheet on each other, and applying pressure to the photo-pressure sensitive sheet and the transfer sheet toward each other, thereby developing images on the transfer sheet;

a feeding means for feeding the superposed photo-pressure sensitive sheet and transfer sheet through the developing means in a feeding direction; and a separating means disposed downstream of the developing means for separating the exposed photo-pressure sensitive sheet from the transfer sheet.

38. A multicolor photocopying apparatus as defined in claim 37, wherein the exposure means includes means for controlling the amount of the exposure of the light having a predetermined wavelength in accordance with the exposure characteristic of the microcapsules on the photo-pressure sensitive sheet.

39. A multicolor photocopying apparatus as defined in claim 37, wherein the plurality of changing means for changing over the passing and shielding of the light permeating in dot units is a liquid crystal panel capable of controlling the light in a dot-matrix unit.

40. A multicolor photocopying apparatus as defined in claim 37, wherein the exposure means includes a light source disposed above the photo-pressure sensitive sheet, and the changing means is disposed between the light source and the photo-pressure sensitive sheet.

41. A multicolor photocopying apparatus as defined in claim 40, wherein the light source has a wavelength characteristic adapted to the sensitivity of microcapsules and corresponding to each color of the photo-pressure sensitive sheet.

42. A multicolor photocopying apparatus as defined in claim 40, further comprising light filtering means for filtering visible light into a light having at least one color filtered therefrom before the light passes through the photo-pressure sensitive sheet.

43. A multicolor photocopying apparatus as defined in claim 40, wherein the light filtering means includes a plurality of filters which allows only a predetermined wavelength light to pass therethrough and a filter driver which selectively provides each filter at a light path.

44. The apparatus of claim 37, wherein the image on the opposite side of the original is blank.

45. A multicolor photocopying apparatus, comprising:

exposure means for irradiating, by visible light from a light source, a colored original carrying an image of a plurality of colors on one side which is different than an image on an opposite side thereof, and for exposing a photo-pressure sensitive sheet to the light which has been reflected from the colored original, the sheet having a coating on at least one surface thereof, the coating containing at least two kinds of microcapsules, the microcapsules having therein a chromogenic material and a photo sensitive material which changes the mechanical strength o the microcapsules by adsorption of the light;

the exposure means including measuring means for measuring a permeability of the original before the exposure of the photo-pressure sensitive sheet by measuring the light which has passed through the original, and a controlling means for controlling an amount of the exposure in accordance with both the permeability and an exposure characteristic of the microcapsules of the photo-pressure sensitive sheet; and developing means for rupturing the microcapsules of low mechanical strength among the microcapsules and for having the chromogenic material of the ruptured microcapsules chemically react with a developing agent on the photo-pressure sensitive sheet or a transfer sheet to develop an image on the photo-pressure sensitive sheet or the transfer sheet.

46. The apparatus of claim 45, wherein the image on the opposite side of the original is blank.

* * * * *